US012120449B2

(12) United States Patent
Asakura

(10) Patent No.: US 12,120,449 B2
(45) Date of Patent: Oct. 15, 2024

(54) IMAGE CAPTURING DEVICE AND ELECTRONIC APPARATUS WITH STACKED CHIP STRUCTURE

(71) Applicant: SONY SEMICONDUCTOR SOLUTIONS CORPORATION, Kanagawa (JP)

(72) Inventor: Luonghung Asakura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 432 days.

(21) Appl. No.: 17/423,810

(22) PCT Filed: Jan. 8, 2020

(86) PCT No.: PCT/JP2020/000301
§ 371 (c)(1),
(2) Date: Jul. 16, 2021

(87) PCT Pub. No.: WO2020/153123
PCT Pub. Date: Jul. 30, 2020

(65) Prior Publication Data
US 2022/0086379 A1    Mar. 17, 2022

(30) Foreign Application Priority Data

Jan. 25, 2019    (JP) .................................. 2019-010933

(51) Int. Cl.
*H04N 25/79*    (2023.01)
*H01L 23/00*    (2006.01)
(Continued)

(52) U.S. Cl.
CPC ............. *H04N 25/79* (2023.01); *H01L 24/08* (2013.01); *H01L 27/14634* (2013.01);
(Continued)

(58) Field of Classification Search
CPC ........ H04N 25/79; H04N 25/40; H04N 25/75; H04N 25/77; H04N 25/74; H01L 24/08;
(Continued)

(56) References Cited

U.S. PATENT DOCUMENTS

| 2012/0293698 | A1 | 11/2012 | Sukegawa et al. |
| 2014/0334601 | A1 | 11/2014 | Shizukuishi |
| 2018/0109741 | A1 | 4/2018 | Sukegawa et al. |
| 2020/0161230 | A1* | 5/2020 | Knickerbocker ............................ H01L 21/76898 |

FOREIGN PATENT DOCUMENTS

| CN | 102782840 A | 11/2012 |
| CN | 107534049 A | 1/2018 |

(Continued)

OTHER PUBLICATIONS

International Search Report and Written Opinion of PCT Application No. PCT/JP2020/000301, issued on Mar. 24, 2020, 11 pages of ISRWO.

*Primary Examiner* — Twyler L Haskins
*Assistant Examiner* — Angel L Garces-Rivera
(74) *Attorney, Agent, or Firm* — CHIP LAW GROUP

(57) ABSTRACT

An image capturing device of the present disclosure has a stacked chip structure in which at least two semiconductor chips including a first semiconductor chip and a second semiconductor chip are stacked. Pixels each including a light receiving portion are arranged on the first semiconductor chip, and a scanning section that selectively scans the pixel and a signal processing section that processes an analog signal output from the pixel are arranged on the second semiconductor chip. Further, the scanning section is arranged along pixel rows of the pixel arrangement in the matrix form.

15 Claims, 26 Drawing Sheets

(51) Int. Cl.
*H01L 27/146* (2006.01)
*H04N 25/40* (2023.01)
*H04N 25/75* (2023.01)
*H04N 25/77* (2023.01)

(52) U.S. Cl.
CPC ....... *H01L 27/14636* (2013.01); *H04N 25/40* (2023.01); *H04N 25/75* (2023.01); *H04N 25/77* (2023.01); *H01L 2224/08145* (2013.01)

(58) Field of Classification Search
CPC ......... H01L 27/14634; H01L 27/14636; H01L 2224/08145; H01L 27/14612
See application file for complete search history.

(56) References Cited

FOREIGN PATENT DOCUMENTS

| | | |
|---|---|---|
| DE | 202010018542 U1 | 7/2017 |
| EP | 2528093 A1 | 11/2012 |
| EP | 3288081 A1 | 2/2018 |
| JP | 2011-159958 A | 8/2011 |
| JP | 2014-220370 A | 8/2011 |
| KR | 10-2012-0111730 A | 10/2012 |
| KR | 10-2017-0141661 A | 12/2017 |
| WO | 2016/170833 A1 | 10/2016 |

* cited by examiner

IMAGE CAPTURING DEVICE AND ELECTRONIC APPARATUS WITH STACKED CHIP STRUCTURE

CROSS REFERENCE TO RELATED APPLICATIONS

This application is a U.S. National Phase of International Patent Application No. PCT/JP2020/000301 filed Jan. 8, 2020, which claims priority benefit of Japanese Patent Application No. JP 2019-010933 filed in the Japan Patent Office on Jan. 25, 2019. Each of the above-referenced applications is hereby incorporated herein by reference in its entirety.

TECHNICAL FIELD

The present disclosure relates to an image capturing device and an electronic apparatus.

BACKGROUND ART

An image capturing device represented by a CMOS image sensor includes a pixel array section (pixel arrangement) in which pixels each including a light receiving portion (photoelectric conversion element) are two-dimensionally arranged in a matrix form, and a circuit section that performs processing related to each pixel of the pixel array section. Further, a so-called stacked chip structure in which at least two semiconductor chips are stacked (see, for example, Patent Document 1) has been developed as a semiconductor chip structure of the image capturing device for the purpose of reducing the chip size and the like, the at least two semiconductor chips including a first semiconductor chip (so-called pixel chip) on which the pixels are arranged and a second semiconductor chip (so-called circuit chip) on which the circuit section is arranged.

CITATION LIST

Patent Document

Patent Document 1: Japanese Patent Application Laid-Open No. 2011-159958

SUMMARY OF THE INVENTION

Problems to be Solved by the Invention

Conventionally, in the image capturing device having the stacked chip structure, a scanning section that selectively scans each pixel of the pixel array section (pixel arrangement) is arranged along pixel columns of the pixel array section, and the circuit section other than the scanning section is arranged along pixel rows, similarly to a case of a so-called flat chip structure in which the circuit section is arranged in the same semiconductor chip as that of the pixel array section. In an image capturing device in which the area of the pixel array section is small in the stacked chip structure, the circuit section can be efficiently arranged without causing a wasteful empty region in the circuit chip even in a case where the circuit chip has the same size as the pixel chip.

On the other hand, in a large-sized image capturing device in which the area of the pixel array section is large, in a case where the size of the circuit chip is the same as that of the pixel chip, there is a high possibility that a wasteful empty region will be caused in the circuit chip by an increase in size of the scanning section arranged along the pixel columns according to the size of the pixel array section in a column direction.

Therefore, an object of the present disclosure is to provide an image capturing device in which no wasteful empty region is caused in the circuit chip (second semiconductor chip) on which the circuit section is arranged even in a case where the area of the pixel array section is large in the stacked chip structure, and an electronic apparatus including the image capturing device.

Solutions to Problems

An image capturing device of the present disclosure for achieving the above-described object has a stacked chip structure in which at least two semiconductor chips including a first semiconductor chip and a second semiconductor chip are stacked,
   in which pixels each including a light receiving portion are two-dimensionally arranged in a matrix form on the first semiconductor chip,
   a scanning section that selectively scans the pixel, and a signal processing section that processes an analog signal output from the pixel are arranged on the second semiconductor chip, and
   the scanning section is arranged along pixel rows of the pixel arrangement in the matrix form.

Further, an electronic apparatus of the present disclosure for achieving the above-described object includes the image capturing device having the above-described configuration.

BRIEF DESCRIPTION OF DRAWINGS

FIG. 3A illustrates an outline of a configuration of a first semiconductor chip, and FIG. 3B illustrates an outline of a configuration of a second semiconductor chip.

FIG. 6A illustrates an outline of a configuration of the first semiconductor chip, and FIG. 6B illustrates an outline of a configuration of the second semiconductor chip.

FIG. 8A illustrates an example of a through silicon via (TSV), and FIG. 8B illustrates an example of a Cu—Cu connection (copper-copper connection).

FIG. 10A illustrates an example in which the pitch of the unit of the scanning section and the unit of the analog-to-digital conversion section are the same as each other, FIG. 10B illustrates an example of effectively utilizing an empty region beside the block of the scanning section, and FIG. 10C illustrates an example in which the pitch of the unit of the scanning section and the pitch of the unit of the analog-to-digital conversion section are different from each other.

FIG. 11A illustrates an outline of a configuration of the first semiconductor chip, and FIG. 11B illustrates an outline of a configuration of the second semiconductor chip.

FIG. 12A illustrates an outline of a configuration of a first semiconductor chip, and FIG. 12B illustrates an outline of a configuration of a second semiconductor chip.

FIG. 13A illustrates an outline of a configuration of the first semiconductor chip, and FIG. 13B illustrates an outline of a configuration of the second semiconductor chip.

FIG. 14A illustrates an outline of a configuration of the first semiconductor chip, and FIG. 14B illustrates an outline of a configuration of the second semiconductor chip.

FIG. 15A illustrates an outline of a configuration of the first semiconductor chip, and FIG. 15B illustrates an outline of a configuration of the second semiconductor chip.

FIG. 16A illustrates a wiring parasitic capacitance in a case where the pixel control line and the vertical signal line are laid out on the same metal layer, and FIG. 16B illustrates a wiring parasitic capacitance in a case where the pixel control line and the vertical signal line are laid out on different metal layers, respectively.

FIG. 17A illustrates an example of a layout of the pixel control line and the vertical signal line, and FIG. 17B illustrates a timing chart in a case where a certain pixel line is accessed.

FIG. 21A illustrates Variation 1, FIG. 21B illustrates Variation 2, and FIG. 21C illustrates Variation 3.

FIG. 22A illustrates Variation 4, and FIG. 22B illustrates Variation 5.

MODE FOR CARRYING OUT THE INVENTION

Figure 1:
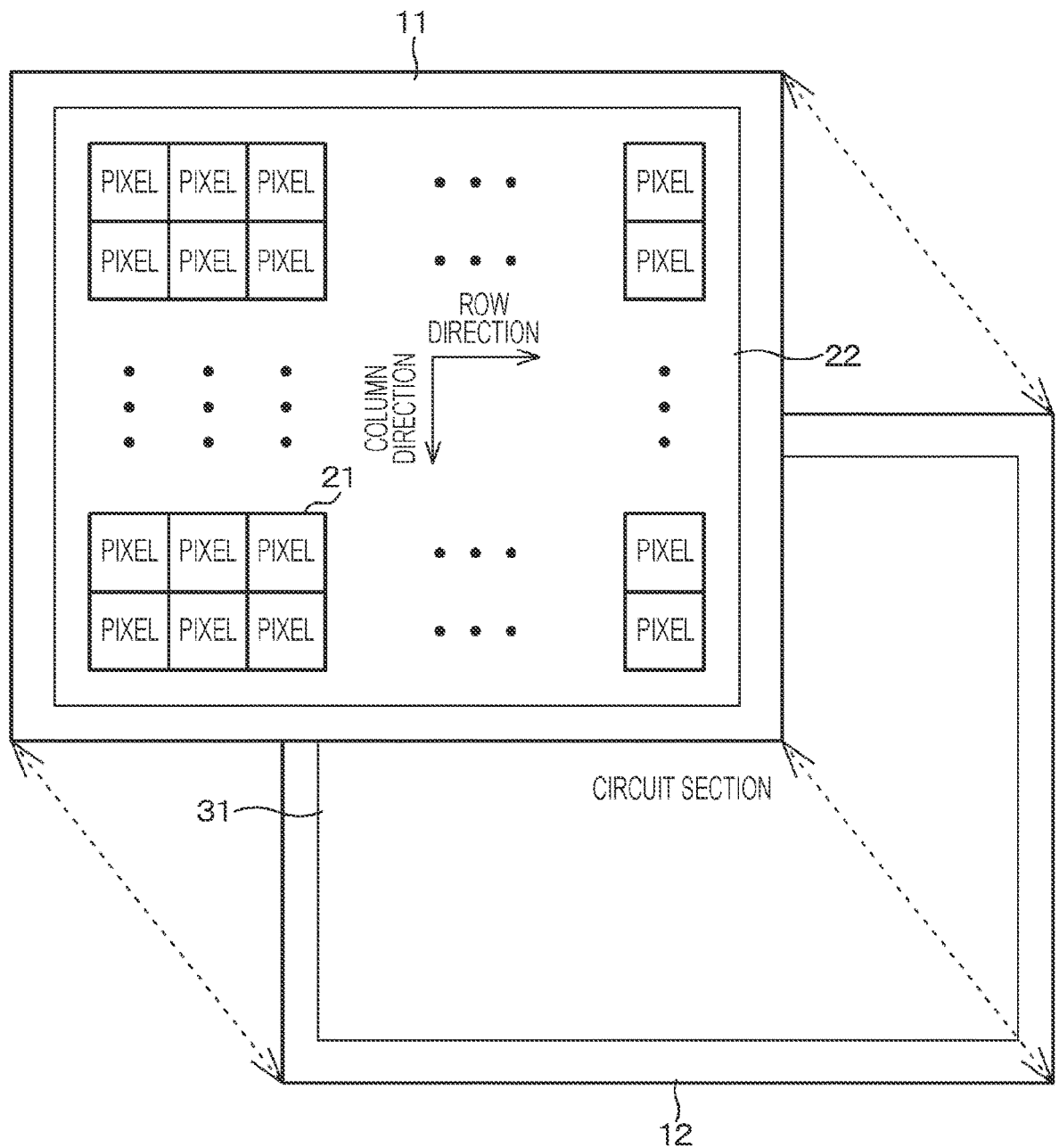
FIG. 1 is an exploded perspective view illustrating an outline of a stacked chip structure of an image capturing device according to an embodiment of the present disclosure.

Hereinafter, a mode for carrying out the technology of the present disclosure (hereinafter, referred to as "embodiment") will be described in detail with reference to the drawings. The technology of the present disclosure is not limited to the embodiment. In the following description, the same reference signs will be used for the same elements or elements having the same function, and an overlapping description will be omitted. Note that descriptions will be provided in the following order.

1. Overall Description of Image Capturing Device and Electronic Apparatus of Present Disclosure
2. Image Capturing Device According to Embodiment
   2-1. Configuration Example of Stacked Chip Structure
   2-2. Example of Circuit Configuration of Pixel
   2-3. Example of Chip Configuration in Conventional Stacked Chip Structure
3. Embodiment of Present Disclosure
   3-1. Example 1 (Example in which Circuit Chip is Arranged on One Side of Pixel Chip in Column Direction)
   3-2. Example 2 (Example in which Circuit Chip is Arranged on Both Sides of Pixel Chip in Column Direction)
   3-3. Example 3 (Example in which Scanning Section is Chip Independent of Circuit Chip)
   3-4. Example 4 (Example in which Scanning Section is Arranged at End Portion in Column Direction)
   3-5. Example 5 (Modification of Example 4: Example in which Scanning Section is Arranged at Central Portion in Column Direction)
   3-6. Example 6 (Example in which Peripheral Circuit And The Like are Arranged at End Portion of Circuit Chip in Row Direction)
   3-7. Example 7 (Example in which Wiring Parasitic Capacitance Coupling is Dispersed)
   3-8. Example 8 (Example Showing Variations of Connection Relationship Between Paths of Pixel Control Line in Column Direction and Row Direction)
4. Modified Example
5. Application Example 6. Application Example of Technology According to Present Disclosure
    6-1. Electronic Apparatus of Present Disclosure (Example of Image Capturing Device)
    6-2. Example of Application to Moving Body
7. Configurations that Present Disclosure Can Take <Overall Description of Image Capturing Device and Electronic Apparatus of Present Disclosure>

The image capturing device and the electronic apparatus of the present disclosure can include a signal processing section including an analog-to-digital conversion section that converts an analog signal output from a pixel into a digital signal. The analog-to-digital conversion section can include a plurality of analog-to-digital converters provided corresponding to pixel rows of a pixel arrangement in a matrix form.

In the image capturing device and the electronic apparatus of the present disclosure having the above-described preferred configuration, a pixel control line wired on a first semiconductor chip and transmitting a signal output from a scanning section to pixels can include a path wired along a column direction of the pixel arrangement, and a path wired along a row direction.

Further, in the image capturing device and the electronic apparatus of the present disclosure having the above-described preferred configuration, the scanning section and the analog-to-digital conversion section can include units having a predetermined circuit as a unit and arranged in parallel. At this time, it is preferable that the number of units of the scanning section is proportional to the number of rows of the pixel arrangement, and the number of units of the analog-to-digital conversion section is proportional to the number of columns of the pixel arrangement.

Further, in the image capturing device and the electronic apparatus of the present disclosure having the above-described preferred configuration, the pitch of the unit of the scanning section and the pitch of the unit of the analog-to-digital conversion section can be the same. Alternatively, the pitch of the unit of the scanning section and the pitch of the unit of the analog-to-digital conversion section can be different from each other. At this time, it is preferable that the layout pitch ratio between the scanning section and the analog-to-digital conversion section is the same as the ratio between the numbers of rows/columns of the pixel arrangement.

Further, in the image capturing device and the electronic apparatus of the present disclosure having the above-described preferred configuration, a second semiconductor chip can be constituted by two chips provided at opposite end portions of the first semiconductor chip in the column direction. Further, the scanning section and the analog-to-digital conversion section can be arranged on each of the two chips, or the scanning section can be arranged on one of the two chips and the analog-to-digital conversion section can be arranged on the other.

Further, in the image capturing device and electronic apparatus of the present disclosure including the above-described preferred configuration, a connection portion that electrically connects the first semiconductor chip and the second semiconductor chip can be a through silicon via (TSV) or a copper-copper connection (Cu—Cu connection). Further, in a case where the connection portion is the copper-copper connection (Cu—Cu connection), the scanning section can be arranged at a central portion in the column direction.

Further, in the image capturing device and electronic apparatus of the present disclosure having the above-described preferred configuration, in a case where the pixel control line wired on the first semiconductor chip and transmitting the signal output from the scanning section to the pixels includes the path wired along the column direction of the pixel arrangement and the path wired along the row direction, the path wired along the column direction can be laid out in a wiring shape in which the path is shifted in the row direction by a predetermined amount at a predetermined length interval.

Further, in the image capturing device and the electronic apparatus of the present disclosure having the above-described preferred configuration, a vertical signal line can be laid out on a first metal layer, the path of the pixel control line in the column direction can be laid out on a second metal layer, the path of the pixel control line in the row direction can be laid out on a third metal layer, and the shift of the path of the pixel control line in the column direction can be realized by row-direction wiring on the second metal layer.

Alternatively, in the image capturing device and the electronic apparatus of the present disclosure having the above-described preferred configuration, the vertical signal line can be laid out on the first metal layer, the path of the pixel control line in the column direction can be laid out on the second metal layer, the path of the pixel control line in the row direction can be laid out on the third metal layer, and the shift of the path of the pixel control line in the column direction can be realized by diagonal-direction wiring on the second metal layer.

Alternatively, in the image capturing device and the electronic apparatus of the present disclosure having the above-described preferred configuration, the vertical signal line and the path of the pixel control line in the column direction can be laid out on the first metal layer, the path of the pixel control line in the row direction can be laid out on the second metal layer, and the shift of the path of the pixel control line in the column direction can be realized by row-direction wiring or diagonal-direction wiring on the second metal layer.

<Image Capturing Device According to Embodiment>
[Configuration Example of Stacked Chip Structure]

An image capturing device according to an embodiment of the present disclosure has a stacked chip structure in which at least two semiconductor chips including a first semiconductor chip and a second semiconductor chip are stacked. FIG. 1 illustrates an exploded perspective view of the stacked chip structure of the image capturing device according to the embodiment of the present disclosure.

The stacked chip structure illustrated in FIG. 1 is a two-layer structure in which two semiconductor chips including a first semiconductor chip 11 and a second semiconductor chip 12 are stacked. Here, a two-layer structure in which two semiconductor chips are stacked is illustrated as the stacked chip structure, but the stacked chip structure can also be a multilayer structure in which three or more semiconductor chips are stacked.

In the two-layer chip structure, the first semiconductor chip 11 as the first layer is a pixel chip, in which a pixel array section 22 including a pixel arrangement in which pixels 21 each including a light receiving portion (for example, photodiode) are two-dimensionally arranged in a matrix form is formed. The second semiconductor chip 12 as the second layer is a circuit chip, in which a circuit section 31 that performs processing related to each pixel 21 of the pixel array section 22, such as selective scanning of the pixels 21 two-dimensionally arranged in a matrix form or signal processing for an analog pixel signal output from the pixel 21, is formed.

[Example of Circuit Configuration of Pixel]

Figure 2:
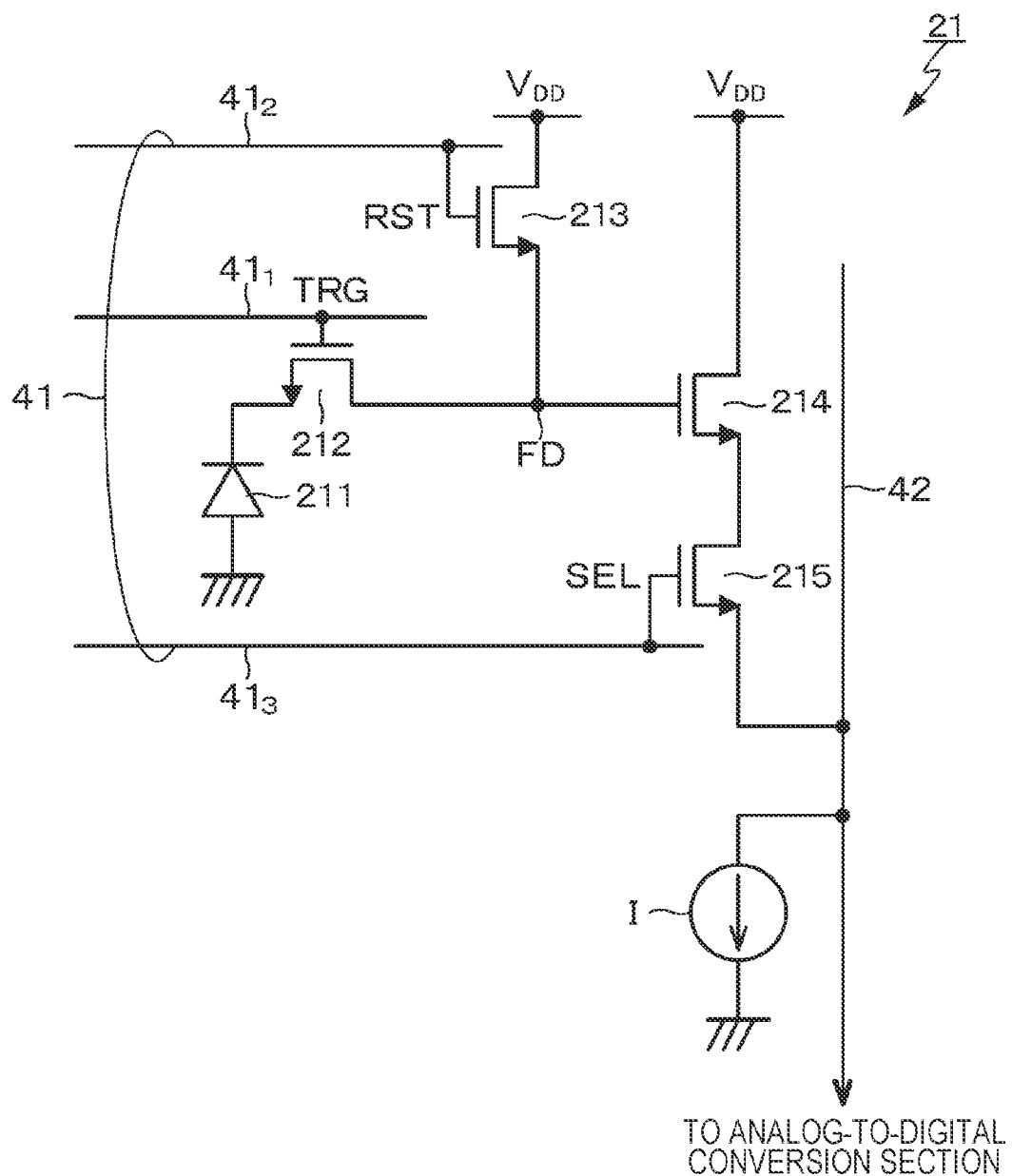
FIG. 2 is a circuit diagram illustrating an example of a circuit configuration of a pixel.

FIG. 2 is a circuit diagram illustrating an example of a circuit configuration of the pixel 21. The pixel 21 includes, for example, a photodiode 211 as a photoelectric conversion element that is the light receiving portion. A pixel circuit of the pixel 21 has a circuit configuration including a transfer transistor 212, a reset transistor 213, an amplification transistor 214, and a selection transistor 215 in addition to the photodiode 211.

As the four transistors including the transfer transistor 212, the reset transistor 213, the amplification transistor 214, and the selection transistor 215, for example, N-channel MOS field effect transistors (FET) are used. As the pixel 21 is configured with only N-channel transistors, it is possible to implement optimization in area efficiency and process reduction. However, a conductive combination of the four transistors 212 to 215 illustrated here is only an example, and the present disclosure is not limited to the combination thereof.

Note that, in the pixel array section 22 of the first semiconductor chip 11, a pixel control line 41 ($41_1$, $41_2$, and $41_3$) is wired along the row direction for each pixel row of the pixel arrangement in a matrix form. Further, a vertical signal line 42 is wired along the column direction for each pixel column. The pixel control line 41 transmits a control signal (drive signal) for performing a control (driving) when reading a signal from the pixel 21.

For the arrangement of the pixels 21 having the above-described configuration, the pixel control line 41 ($41_1$, $41_2$, and $41_3$) is commonly wired to each pixel 21 in the same pixel row. The pixel control line 41 ($41_1$, $41_2$, and $41_3$) is connected to output ends of scanning sections 32A and 32B (see FIG. 3B) as described later in a unit of pixel row, the output ends corresponding to each pixel row. The scanning sections 32A and 32B appropriately output a transfer signal TRG to the pixel control line $41_1$, output a reset signal RST to the pixel control line $41_2$, and output a selection signal SEL to the pixel control line $41_3$.

In the photodiode 211, an anode electrode is connected to a low-potential side power supply (for example, ground), and received light is photoelectrically transformed into a photocharge (here, a photoelectron) having a charge amount corresponding to the amount of the received light, and the photocharge is accumulated. A cathode electrode of the photodiode 211 is electrically connected to a gate electrode of the amplification transistor 214 via the transfer transistor 212. Here, a node to which the gate electrode of the amplification transistor 214 is electrically connected is a floating diffusion (floating diffusion region/impurity diffusion region) FD. The floating diffusion FD is a charge-voltage conversion section that converts electric charge into voltage.

The transfer signal TRG that is active high (for example, $V_{DD}$ level) is applied to a gate electrode of the transfer transistor 212 from the scanning sections 32A and 32B through the pixel control line $41_1$. When the transfer transistor 212 becomes conductive in response to the transfer signal TRG, the photocharge that is obtained through the photoelectric transformation performed by the photodiode 211, and is accumulated in the photodiode 211 is transferred to the floating diffusion FD.

The reset transistor 213 is connected between a node of a high-potential side power supply voltage $V_{DD}$ and the floating diffusion FD. The reset signal RST that is active high is applied to a gate electrode of the reset transistor 213 from the scanning sections 32A and 32B through the pixel control line $41_2$. The reset transistor 213 becomes conductive in response to the reset signal RST, and resets the floating diffusion FD by discarding the charge of the floating diffusion FD to the node of the power supply voltage $V_{DD}$.

In the amplification transistor 214, a gate electrode is connected to the floating diffusion FD, and a drain electrode is connected to the node of the high-potential side power supply voltage $V_{DD}$. The amplification transistor 214 serves as an input unit of a source follower that reads a signal obtained by the photoelectric transformation performed by the photodiode 211. That is, in the amplification transistor 214, a source electrode is connected to the vertical signal line 42 via the selection transistor 215. Further, the amplification transistor 214 and a current source I connected to one end of the vertical signal line 42 form the source follower that converts the voltage of the floating diffusion FD into the potential of the vertical signal line 42.

In the selection transistor 215, a drain electrode is connected to the source electrode of the amplification transistor 214, and a source electrode is connected to the vertical signal line 42. The selection signal SEL that is active high is applied to a gate electrode of the selection transistor 215 from the scanning sections 32A and 32B through the pixel control line $41_3$. The selection transistor 215 becomes conductive in response to the selection signal SEL, such that a signal output from the amplification transistor 214 is transmitted to the vertical signal line 42 in a state where the pixel 21 is selected.

Note that the selection transistor 215 can have a circuit configuration in which the selection transistor 215 is connected between the node of the high-potential side power supply voltage $V_{DD}$ and the drain electrode of the amplification transistor 214. Further, in this example, a 4 Tr configuration including four transistors (Tr), that is, the transfer transistor 212, the reset transistor 213, the amplification transistor 214, and the selection transistor 215 is described as an example of the pixel circuit of the pixel 21, but the pixel circuit of the pixel 21 is not limited thereto. For example, the pixel circuit of the pixel 21 can also be a 3 Tr configuration in which the selection transistor 215 is omitted, and the amplification transistor 214 has the function of the selection transistor 215, or can be a 5 or more Tr configuration including an increased number of transistors as needed.

[Example of Chip Configuration in Conventional Stacked Chip Structure]

Figure 3A:
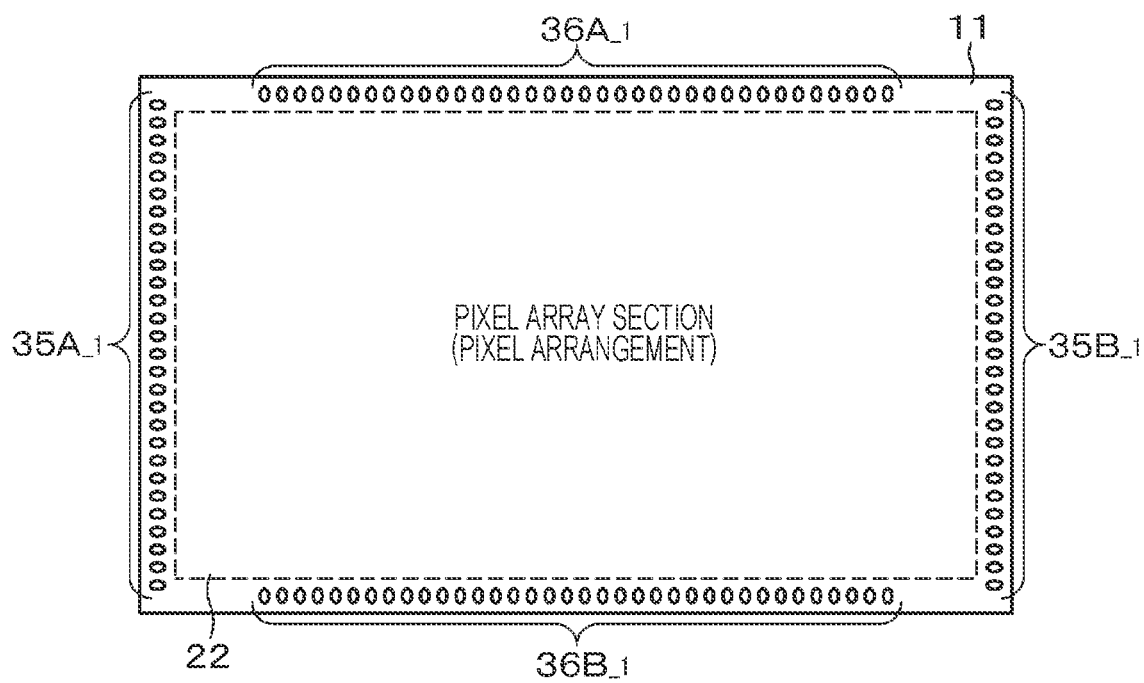
FIGS. 3A and 3B are diagrams illustrating a stacked chip structure according to a conventional example.
Figure 3B:
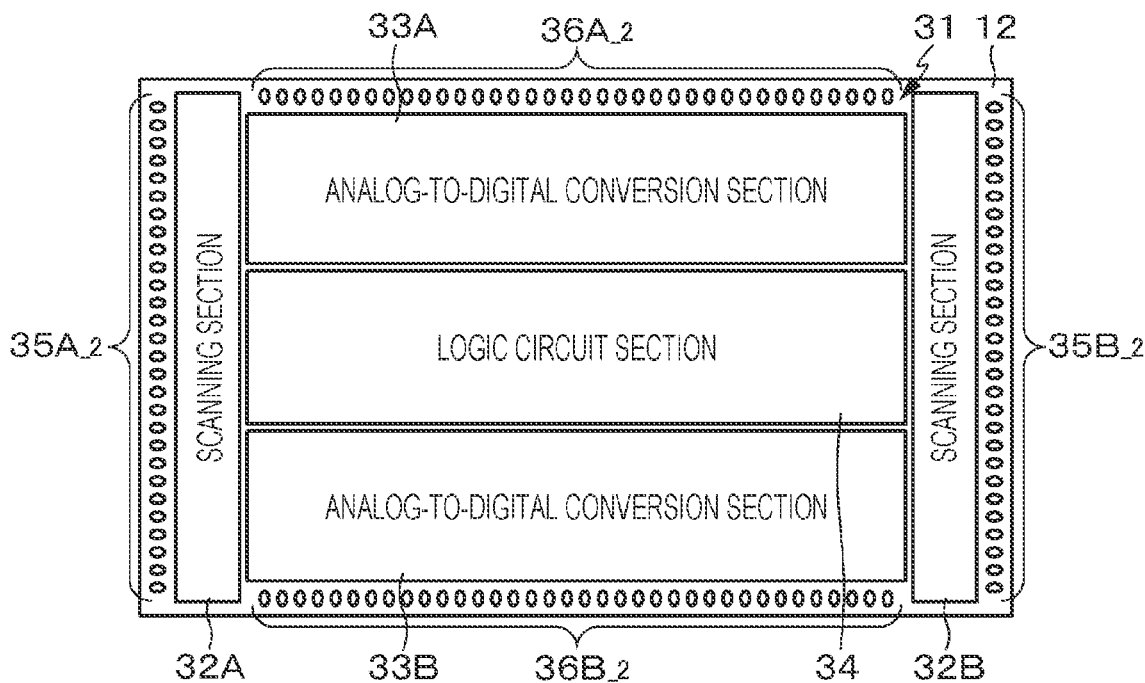

Here, an example of a chip configuration in a conventional stacked chip structure will be described. FIG. 3A illustrates an outline of the configuration of the first semiconductor chip 11 as a pixel chip in the conventional stacked chip structure, and FIG. 3B illustrates an outline of the configuration of the second semiconductor chip 12 as a circuit chip.

In the stacked chip structure of the first semiconductor chip 11 and the second semiconductor chip 12, the first semiconductor chip 11 and the second semiconductor chip 12 are electrically connected through a connection portion such as a bump, a through chip via (TCV), or a copper-copper connection (Cu—Cu connection). In the following description, in a case where the connection portion is the Cu—Cu connection, for example, among connection portions for connecting the pixel control line 41 ($41_1$, $41_2$, and $41_3$) between the first semiconductor chip 11 and the second semiconductor chip 12, a connection portion adjacent to the first semiconductor chip 11 is described as a connection portion $35_{-1}$, and a connection portion adjacent to the second semiconductor chip 12 is described as a connection portion $35_{-2}$. Further, among connection portions for connecting the vertical signal line 42 between the first semiconductor chip 11 and the second semiconductor chip 12, a connection portion adjacent to the first semiconductor chip 11 is described as a connection portion $36_{-1}$, and a connection portion adjacent to the second semiconductor chip 12 is described as a connection portion $36_{-2}$. Moreover, in a case where the connection portions $35_{-1}$ and $35_{-2}$ and the connection portions $36_{-1}$ and $36_{-2}$ exist on opposite sides (upper and lower/left and right) of a board, the connection portions $35_{-1}/35_{-2}$ are described as the connection portions $35A_{-1}$ and $35B_{-1}/35A_{-2}$ and $35B_{-2}$, and the connection portions $36_{-1}/36_{-2}$ are described as the connection portions $36A_{-1}$ and $36B_{-1}/36A_{-2}$ and $36B_{-2}$.

The circuit section 31 that performs processing related to each pixel 21 of the pixel array section 22 includes the scanning sections 32A and 32B, and a signal processing section that processes an analog signal output from the pixel 21, specifically, analog-to-digital conversion sections 33A and 33B and a logic circuit section 34. The scanning sections 32A and 32B perform selective scanning of each pixel 21 of the pixel array section 22 through the pixel control line 41 ($41_1$, $41_2$, and $41_3$).

The analog-to-digital conversion sections 33A and 33B are so-called column-parallel analog-to-digital conversion sections including a set of a plurality of analog-to-digital converters provided corresponding to the pixel columns of the pixel array section 22 (for example, provided for each pixel column). The analog-to-digital conversion sections 33A and 33B convert an analog pixel signal output through the vertical signal line 42 for each pixel column of the pixel array section 22 into a digital signal.

As the analog-to-digital converter in the column-parallel analog-to-digital conversion sections 33A and 33B, for example, a single-slope analog-to-digital converter, which is an example of a reference signal comparison analog-to-digital converter, can be used. However, the analog-to-digital converter is not limited to the single-slope analog-to-digital converter, and a sequential comparison analog-to-digital converter, a delta-sigma modulation (A modulation) analog-to-digital converter, or the like can be used.

The logic circuit section 34 reads a pixel signal digitized by the analog-to-digital conversion sections 33A and 33B, performs predetermined signal processing, and performs processing of generating two-dimensional image data, or the like. For example, in the logic circuit section 34, as the predetermined signal processing, correction of vertical line defects and point defects, clamping of a signal, or digital signal processing such as parallel-serial conversion, compression, coding, addition, averaging, or intermittent operation is performed. Further, the logic circuit section 34 outputs the generated image data as an output signal of the image capturing device to a device in the later stage.

FIGS. 3A and 3B illustrate a case of an image capturing device in which the area of the pixel array section 22 is small as an example of the chip configuration in the conventional stacked chip structure. In the image capturing device in which the area of the pixel array section 22 is small, even in a case where the size of the second semiconductor chip 12 which is a circuit chip is the same as the size of the first semiconductor chip 11 which is a pixel chip as illustrated in the drawings, the circuit section 31, specifically, the scanning sections 32A and 32B, the analog-to-digital conversion sections 33A and 33B, and the logic circuit section 34 can be arranged efficiently (that is, area-efficiently) without causing a wasteful empty region in the second semiconductor chip 12.

On the other hand, in a large-sized image capturing device in which the area of the pixel array section 22 is large, in a case where the size of the second semiconductor chip 12 is the same as the size of the first semiconductor chip 11, the size of the scanning sections 32A and 32B arranged along the pixel columns is increased corresponding to the size of the pixel array section 22 in the column direction. Therefore, a wasteful empty region is caused in the second semiconductor chip 12 by an increase in size of the scanning sections 32A and 32B, and thus, there is a high possibility that the area efficiency deteriorates.

Figure 4A:
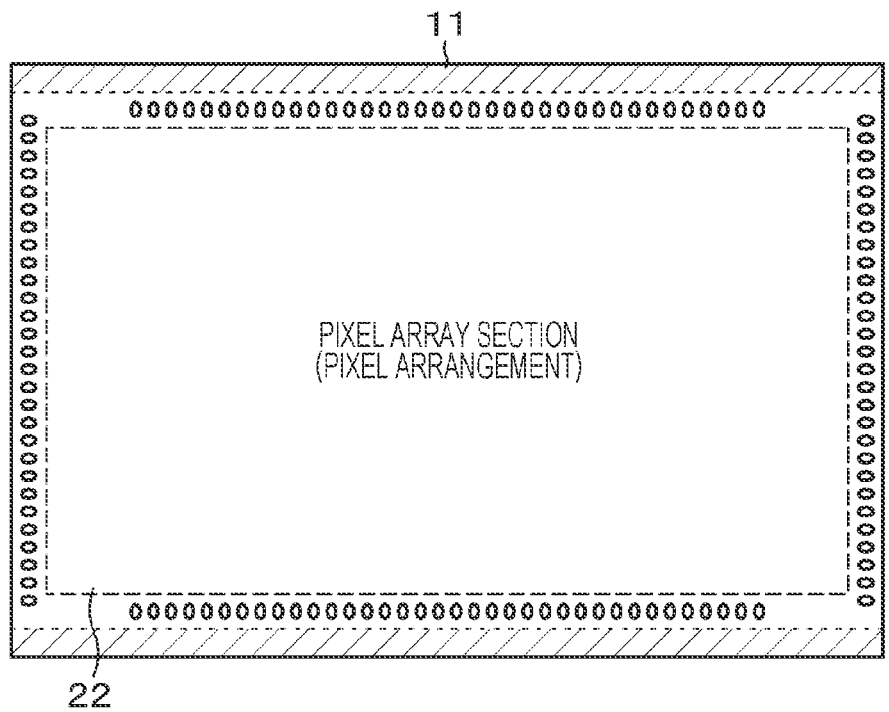
FIGS. 4A and 4B are diagrams illustrating an outline of configurations of a first semiconductor chip and a second semiconductor chip in a case where the second semiconductor chip is divided into smaller chips.
Figure 4B:
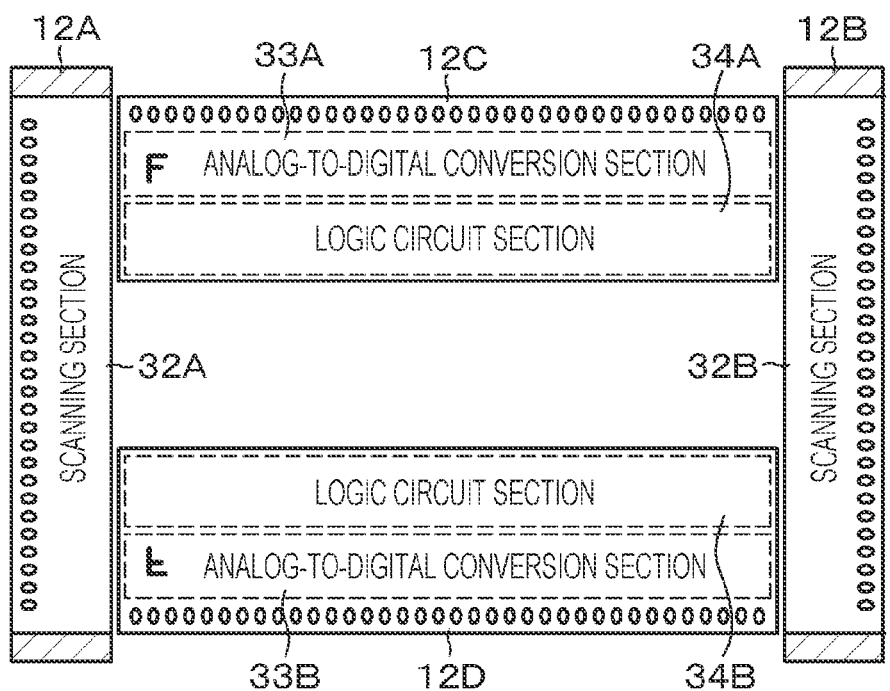
Figure 5:
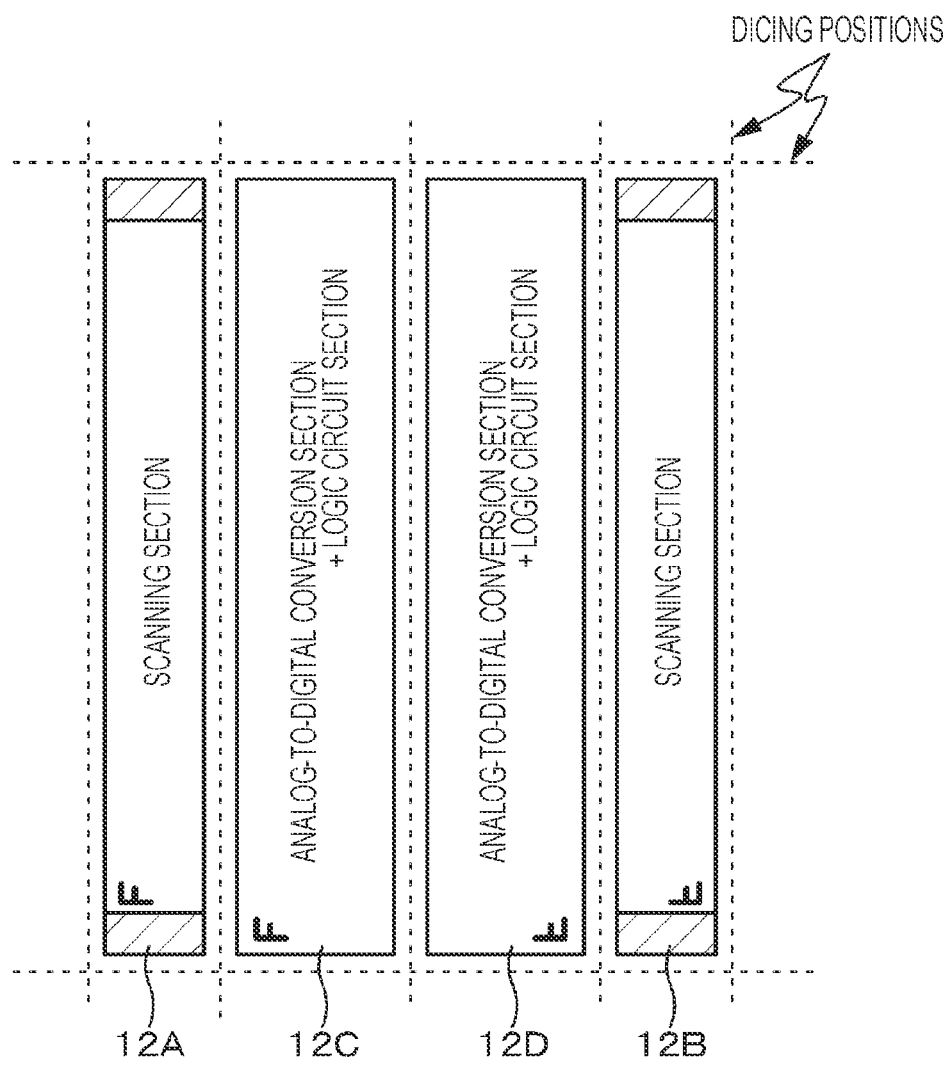
FIG. 5 is a diagram for describing dicing of two chips including scanning sections and two chips including an analog-to-digital conversion section and a logic circuit section.

In a case where the size of the second semiconductor chip 12 is the same as that of the first semiconductor chip 11, it is more area-efficient to divide the second semiconductor chip 12 into smaller chips. For example, as illustrated in FIGS. 4A and 4B, the second semiconductor chip 12 is divided into a total of four chips including two chips 12A and 12B that include the scanning sections 32A and 32B and are arranged on sides along the pixel columns of the first semiconductor chip 11, and two chips 12C and 12D that include the analog-to-digital conversion sections 33A and 33B, and the logic circuit section 34 (34A and 34B) and are arranged on sides along the pixel row of the first semiconductor chip 11. Then, as illustrated in FIG. 5, the diced second semiconductor chip 12 (12A to 12D) is attached to the first semiconductor chip 11 in a state of a wafer.

As described above, a stacked chip having a chip on wafer (COW) structure in which a wafer and a non-defective chip are bonded together has two merits. The first is that there is no restriction that the first semiconductor chip 11 and the second semiconductor chip 12 have the same size (same area), and the second semiconductor chip 12 is only required to have the area sufficient for mounting the necessary circuits, therefore, the area efficiency is excellent. The second is that sorting of a defective product can be performed separately for the first semiconductor chip 11 and the second semiconductor chip 12 before bonding, and non-defective products can be selectively combined, such that it is possible to reduce the defective rate of completed chips and increase the yield.

By the way, since the conventional stacked chip has a wafer on wafer (WOW) structure in which wafers are bonded to each other, in a case where any one of the chips to be bonded is defective, the bonded chips become a defective product.

However, the stacked chip having the chip on wafer (COW) structure has the following problems. In a case where the second semiconductor chip 12 is divided into four chips 12A to 12D as illustrated in FIG. 4B, it is preferable that the four chips 12A to 12D are simultaneously produced with the same mask in consideration of the chip production efficiency. Otherwise, the chips 12A and 12B including the scanning sections 32A and 32B and the chips 12C and 12D including the analog-to-digital conversion sections 33A and 33B and the logic circuit section 34 (34A and 34B) are manufactured separately, and as a result, the costs for the masks and a flow process are doubled.

Further, when dicing into the four chips 12A to 12D, it is necessary that the lengths of the four chips 12A to 12D are the same as each other as illustrated in FIG. 5. Therefore, it is necessary to make the height of the chips 12A and 12B of the scanning sections 32A and 32B be the same as that of the wide chips 12C and 12D including the analog-to-digital conversion sections 33A and 33B and the logic circuit section 34 (34A and 34B). Originally, it is sufficient that the height of the chips 12A and 12B is the same as the height of the pixel array section 22 in the column direction.

As a result, wasteful empty regions (hatched regions in FIG. 5) are caused in the chips 12A and 12B of the scanning sections 32A and 32B. Moreover, it is necessary to prepare, as the second semiconductor chip 12, a chip that can receive the chips 12A and 12B of the scanning sections 32A and 32B including the wasteful empty regions. Therefore, as illustrated in FIG. 4A, the size of the first semiconductor chip 11 in the column direction is increased.

Furthermore, since the scanning sections 32 (32A and 32B) are arranged along the pixel columns of the pixel arrangement on the second semiconductor chip 12, there are the following problems. In the image capturing device, in many cases, an external output circuit such as an LVDS/MIPI that outputs data to the outside and an analog peripheral circuit such as a PLL or a reference current/voltage generation circuit are also arranged along the pixel columns on the outer side of the second semiconductor chip 12 than the scanning section 32.

Therefore, a signal line that transmits a signal between the logic circuit section 34 and the external output circuit and between the analog-to-digital conversion sections 33A and 33B and the analog peripheral circuit needs to pass through a region of the scanning section 32 and a region of the connection portion $35_{-2}$, ($35A_{-2}$ and $35B_{-2}$) of the pixel control line 41. Therefore, it becomes difficult to guarantee a timing for a signal and characteristics such as shields and the like, and in some cases, it is necessary to add a metal layer.

Embodiment of Present Disclosure

In the embodiment of the present disclosure, in the stacked chip structure in which at least two semiconductor chips including the first semiconductor chip 11 as a pixel chip and the second semiconductor chip 12 as a circuit chip are stacked, the scanning sections 32A and 32B are arranged along the pixel rows (in the row direction) of the pixel arrangement of the pixel array section 22 in a matrix form.

Generally, the number of pixels in the pixel row is larger than the number of pixels in the pixel column, and a side of the rectangular shape of the first semiconductor chip 11 along the pixel row is longer than a side thereof along the pixel column. Therefore, the scanning sections 32A and 32B are arranged along the pixel rows on the same long side as the signal processing section including the analog-to-digital conversion sections 33A and 33B. The analog-to-digital conversion sections 33A and 33B include a set of a plurality of analog-to-digital converters arranged along the pixel rows of the pixel arrangement of the pixel array section 22.

Conventionally, the scanning sections 32A and 32B are arranged on the short side along the pixel column. In this case, as described above, wasteful empty regions are caused in the chips 12A and 12B of the scanning sections 32A and 32B, which hinders the optimization of the area of the second semiconductor chip 12 as a circuit chip in the COW structure. On the other hand, the scanning sections 32A and 32B are arranged along the pixel rows (in the row direction) on the same long side as the signal processing section including the analog-to-digital conversion sections 33A and 33B. Therefore, even in a large-sized image capturing device in which the area of the pixel array section 22 is large, no wasteful empty region is caused in the second semiconductor chip 12 in the COW structure, and the area of the second semiconductor chip 12 can be easily optimized. Further, the number of chips into which the second semiconductor chip 12 as a circuit chip is divided can be reduced, such that the number of chips can be easily optimized.

Hereinafter, specific examples of the present embodiment in which the scanning sections 32A and 32B are arranged along the pixel rows of the pixel arrangement in a matrix form in the stacked chip structure will be described.

EXAMPLE 1

Figure 6A:
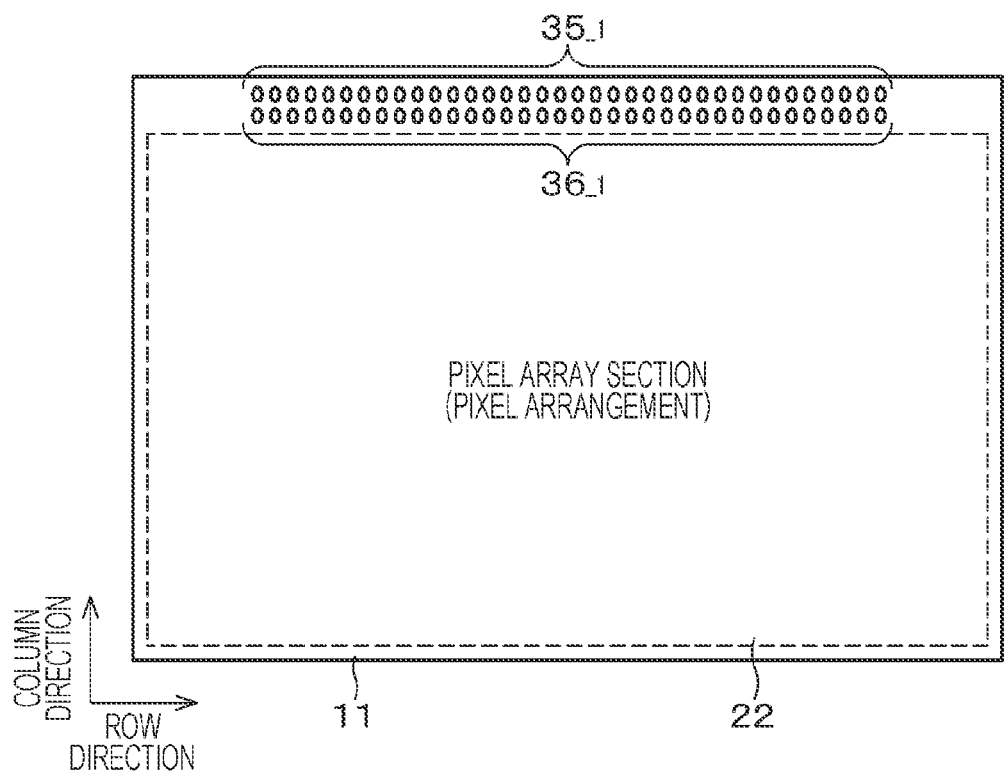
FIGS. 6A and 6B are diagrams illustrating a stacked chip structure according to Example 1.
Figure 6B:
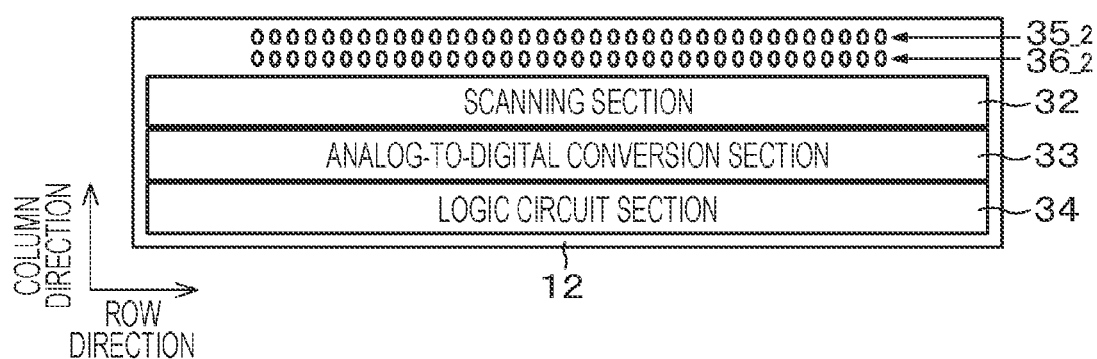

Example 1 is an example in which the second semiconductor chip 12 as a circuit chip is arranged on one side (one end portion) of the first semiconductor chip 11 as a pixel chip in the column direction (vertical direction). FIGS. 6A and 6B are diagrams illustrating a stacked chip structure according to Example 1, FIG. 6A illustrates an outline of a configuration of the first semiconductor chip 11, and FIG. 6B illustrates an outline of a configuration of the second semiconductor chip 12.

In the stacked chip structure according to Example 1, the connection portions $35_{-1}$ and $35_{-2}$ of the pixel control line 41 and the connection portions $36_{-1}$ and $36_{-2}$ of the vertical signal line 42 are arranged side by side, respectively, and are provided on one side (the upper side in the drawing) of the pixel array section 22 in the column direction of the first semiconductor chip 11 and the second semiconductor chip 12 along the row direction. Then, the scanning section 32 is arranged at a portion on one side (the upper side in the drawing) of the first semiconductor chip 11 and under the connection portion $35_{-1}$ and the connection portion $36_{-1}$ along the row direction (pixel row) of the pixel array section 22, together with the analog-to-digital conversion section 33 and the logic circuit section 34.

Specifically, the connection portion $35_{-2}$, the connection portion $36_{-2}$, the scanning section 32, the analog-to-digital conversion section 33, and the logic circuit section 34 are arranged in this order on the second semiconductor chip 12 from the outer side of the chip. However, the order in which the connection portion $35_{-2}$, the connection portion $36_{-2}$, the scanning section 32, the analog-to-digital conversion section 33, and the logic circuit section 34 are arranged is not limited to the order illustrated in FIG. 6B.

As described above, the stacked chip structure according to Example 1 has a configuration in which one second semiconductor chip 12 including the scanning section 32 arranged along the pixel row is arranged on one side of the first semiconductor chip 11. The stacked chip structure according to Example 1 is suitable as a stacked chip structure for a low-speed, low-cost image capturing device.

Figure 7:
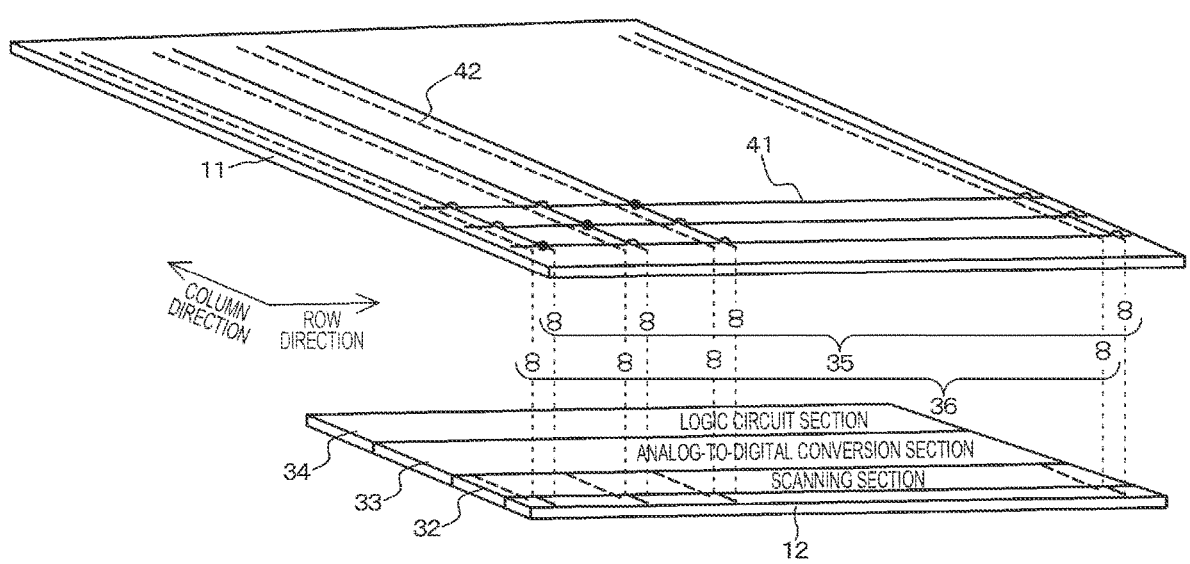
FIG. 7 is an exploded perspective view for describing an outline of wiring of a pixel control line and a vertical signal line in the first semiconductor chip and connection between the first semiconductor chip and the second semiconductor chip.

The exploded perspective view of FIG. 7 illustrates an outline of wiring of the pixel control line 41 and the vertical signal line 42 in the first semiconductor chip 11, and connection between the first semiconductor chip 11 and the second semiconductor chip 12. As illustrated in FIG. 7, the vertical signal line 42 is linearly wired on the first semiconductor chip 11 along the column direction for each pixel column of the pixel arrangement in a matrix form. Further, the vertical signal line 42 is electrically connected to the second semiconductor chip 12 via the connection portion 361 and the connection portion $36_{-2}$, passes through the scanning section 32, and is connected to each analog-to-digital converter of the analog-to-digital conversion section 33 on the second semiconductor chip 12.

The output end of the scanning section 32 on the second semiconductor chip 12 is electrically connected to the first semiconductor chip 11 via the connection portion 352 and the connection portion $35_{-1}$. On the first semiconductor chip 11, the pixel control line 41 has a wiring structure in which a pixel control line 41 is first wired along the column direction and is switched to a pixel control line 41 in the row direction at a position of a corresponding pixel row. That is, the pixel control line 41 includes a path wired along the column direction and a path wired along the row direction.

Figure 8A:
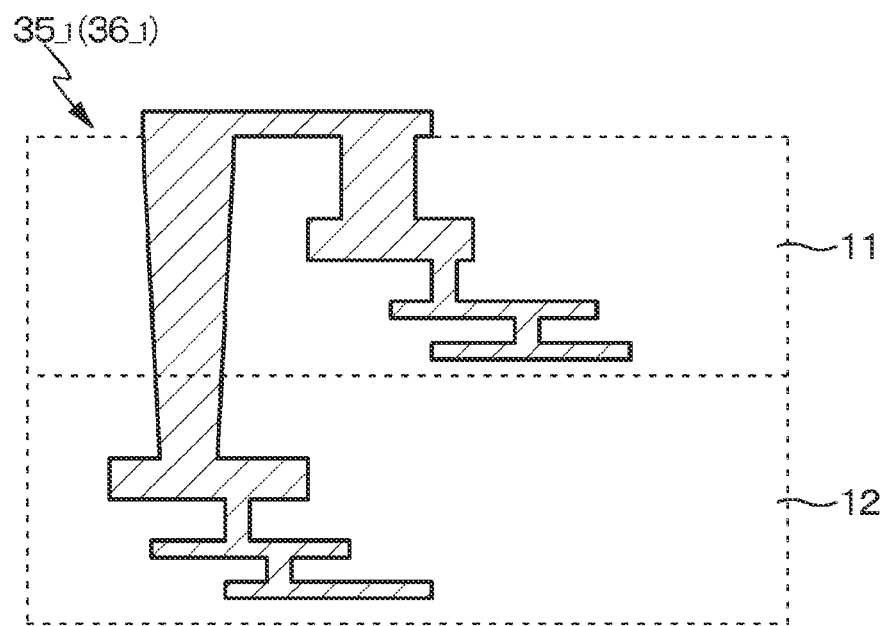
FIGS. 8A and 8B are cross-sectional views illustrating configuration examples of a connection portion that electrically connects the first semiconductor chip and the second semiconductor chip.
Figure 8B:
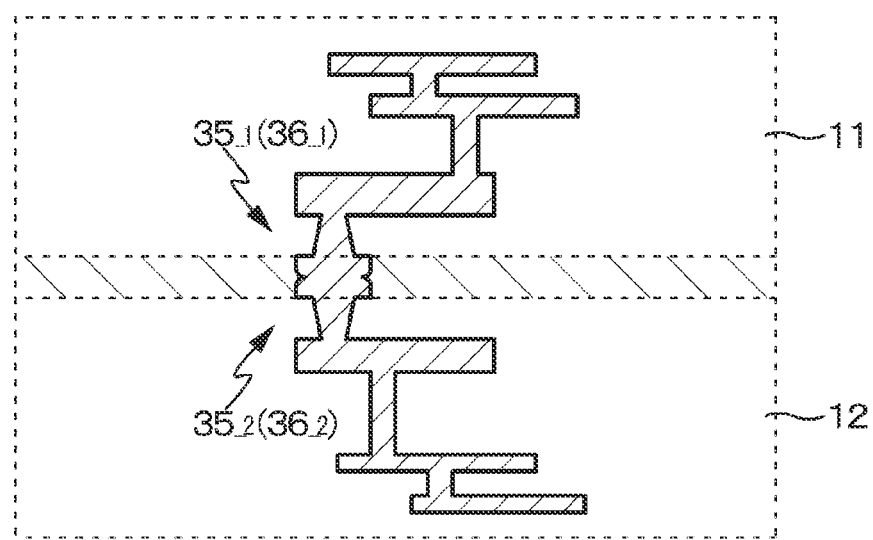

Here, two types of connection portions including a through silicon via (TSV) illustrated in FIG. 8A, and a copper-copper connection (Cu—Cu connection) illustrated in FIG. 8B are illustrated as the connection portion that electrically connects the first semiconductor chip 11 and the second semiconductor chip 12.

In the former case, since it is necessary to produce the connection portions $35_{-1}$ and $36_{-1}$ penetrating through the first semiconductor chip 11 which is a pixel chip, the connection portions $35_{-1}$ and $36_{-1}$ cannot be arranged in a region of the pixel arrangement (that is, the pixel array section 22). Therefore, the arrangement positions of the connection portions $35_{-1}$ and $36_{-1}$ are inevitably the peripheral portions of the first semiconductor chip 11 and the second semiconductor chip 12.

Figure 9:
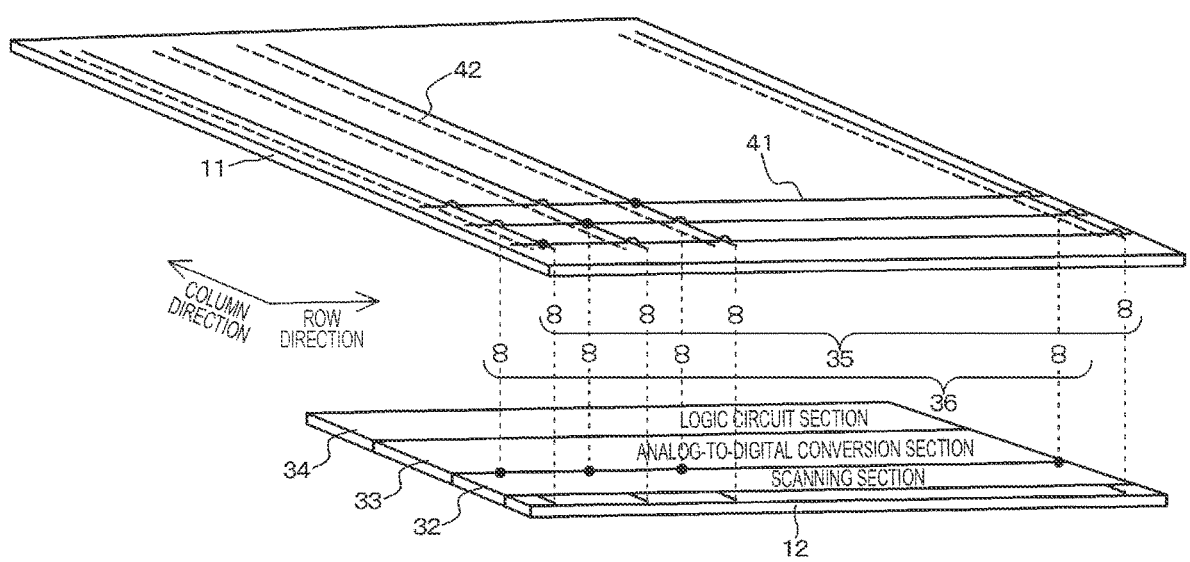
FIG. 9 is a diagram illustrating the effect in a case of the Cu—Cu connection.

In the latter case, as illustrated in FIG. 9, the arrangement positions of the connection portions $36_{-1}$ and $36_{-2}$ of the vertical signal line 42 can be set to an input end of the analog-to-digital conversion section 33. As a result, the wiring of the vertical signal line 42 passing over the scanning section 32 on the second semiconductor chip 12 (see FIG. 7) becomes unnecessary, and the load on the vertical signal line 42 can be reduced accordingly. Further, since the number of wires in the region of the scanning section 32 is reduced, the number of metals required can be reduced.

For the scanning section 32 and the analog-to-digital conversion section 33, units having a predetermined circuit as a unit are produced, and the units are aligned (arranged) in parallel to produce a large block. Here, the number of units of the scanning section 32 is proportional to the number of rows of the pixel arrangement, and similarly, the number of units of the analog-to-digital conversion section 33 is proportional to the number of columns of the pixel arrangement. In general, the number of pixels in the row direction (horizontal direction) (the number of columns of the pixel arrangement) is often different from the number of pixels in the column direction (vertical direction) (the number of rows of the pixel arrangement). For example, in an image capturing device mounted on a camera, the pixel arrangement has a horizontally long shape in which the number of pixel columns is larger than the number of pixel rows.

In a configuration in which the scanning section 32 and the analog-to-digital conversion section 33 are arranged along the long side of the chip, that is, along the pixel rows of the pixel arrangement, two options can be exemplified in determining the layout size of the unit of the scanning section 32. These two options will be described with reference to FIGS. 10A, 10B, and 10C.

Figure 10A:
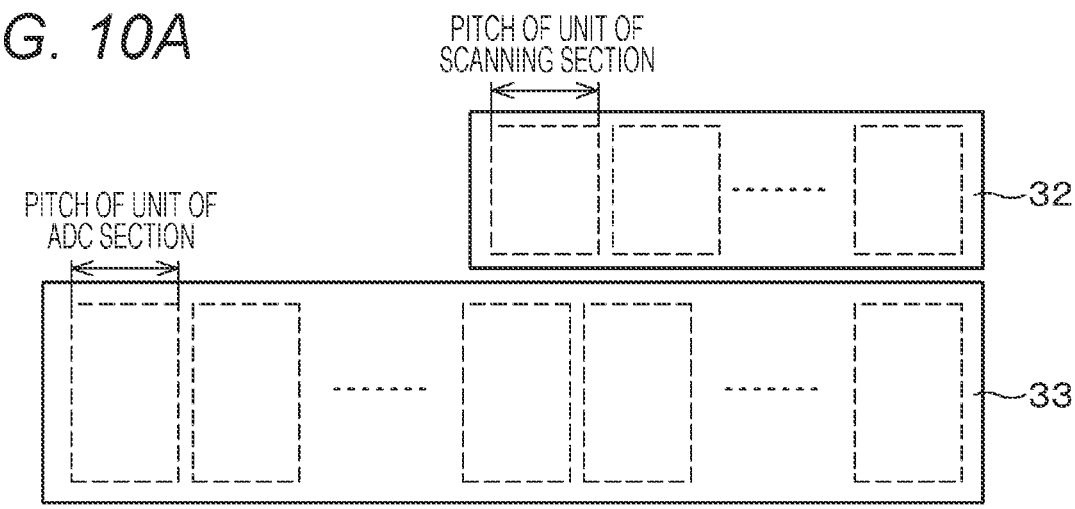
FIGS. 10A, 10B, and 10C are diagrams for describing a layout of units of the scanning section and units of the analog-to-digital conversion section.

One option is to make the pitch of the unit of the scanning section 32 and the pitch of the unit of the analog-to-digital conversion section 33 be the same as each other as illustrated in FIG. 10A. In a normal image capturing device, the number of pixels in the pixel row is larger than the number of pixels in the pixel column, and thus, the width size of the block of the scanning section 32 is smaller than the width size of the block of the analog-to-digital conversion section 33. In this case, an empty region is generated next to the block of the scanning section 32 (see FIG. 10A).

Figure 10B:
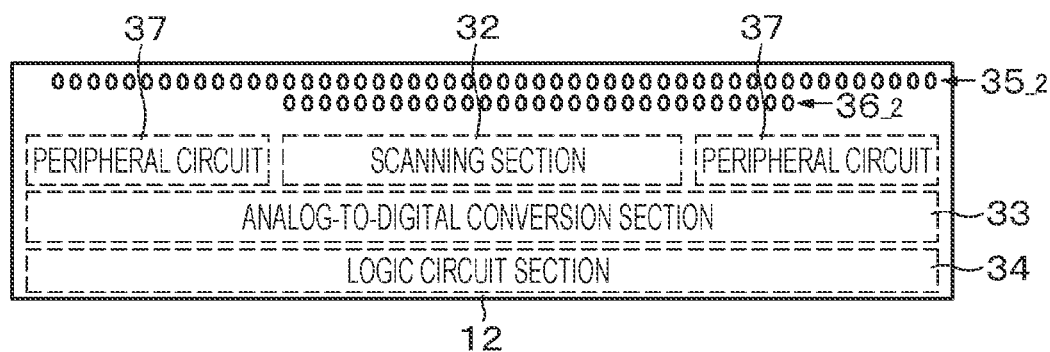

Therefore, the empty region can be effectively used by arranging another circuit, for example, an analog peripheral circuit 37 such as an interface or a PLL, in the empty region next to the block of the scanning section 32 as illustrated in FIG. 10B. Since the pitch of the unit of the scanning section 32 and the pitch of the unit of the analog-to-digital conversion section 33 are the same as each other, the layout of the pixel control line 41 in the column direction (vertical direction) and the layout of the vertical signal line 42 have a similar pattern in each column. Therefore, there is an advantage that the wiring loads (corresponding circuit characteristics) can be easily made uniform.

Figure 10C:
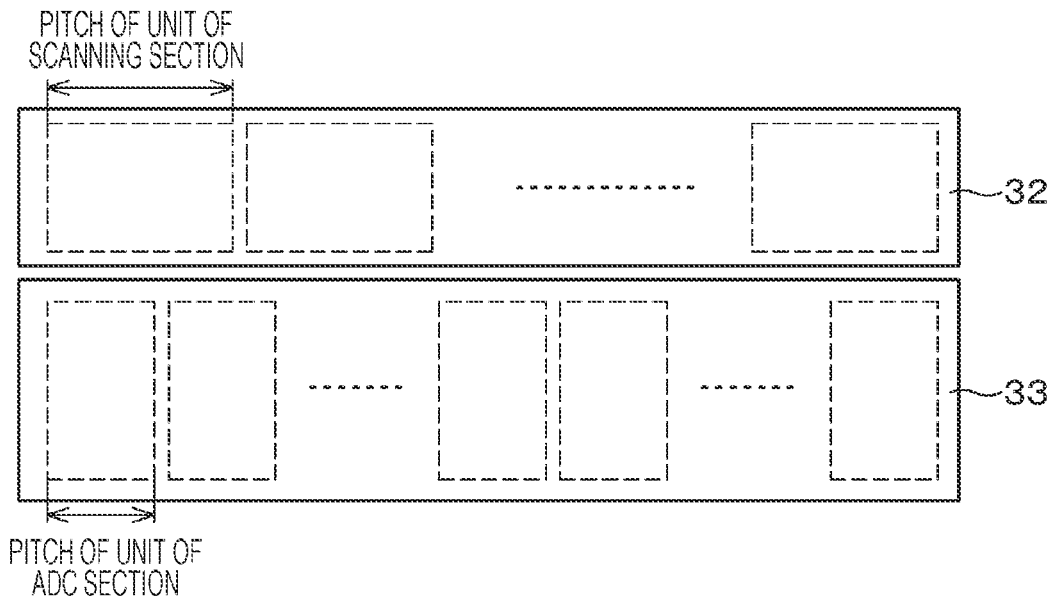

The other option is to make the pitch of the unit of the scanning section 32 different from the pitch of the unit of the analog-to-digital conversion section 33 as illustrated in FIG. 10C, and to make the layout pitch ratio between the scanning section 32 and the analog-to-digital conversion section 33 be the same as the ratio between the numbers of rows/columns of the pixel arrangement. As a result, the block of the scanning section 32 and the block of the analog-to-digital conversion section 33 can have almost the same width, such that the unit width of the scanning section 32, which includes a smaller number of units than the analog-to-digital conversion section 33, can be increased. As a result, in a case where the pixel control line 41 in the column direction (vertical direction) is connected to the input end of the analog-to-digital conversion section 33 through the scanning section 32, there is an advantage that the pixel control line 41 can be easily passed through.

On the other hand, since the pitch of the unit of the scanning section 32 and the pitch of the unit of the analog-to-digital conversion section 33 are not the same as each other, the layout pattern of the pixel control line 41 in the column direction (vertical direction) and the vertical signal line 42 varies for each pixel column. Therefore, the wiring loads become ununiform, which may adversely affect the circuit characteristics. One of the above-described two options is selected in consideration of the requirements of the image capturing device such as the number of wires and the impact on the circuit characteristics.

EXAMPLE 2

Figure 11A:
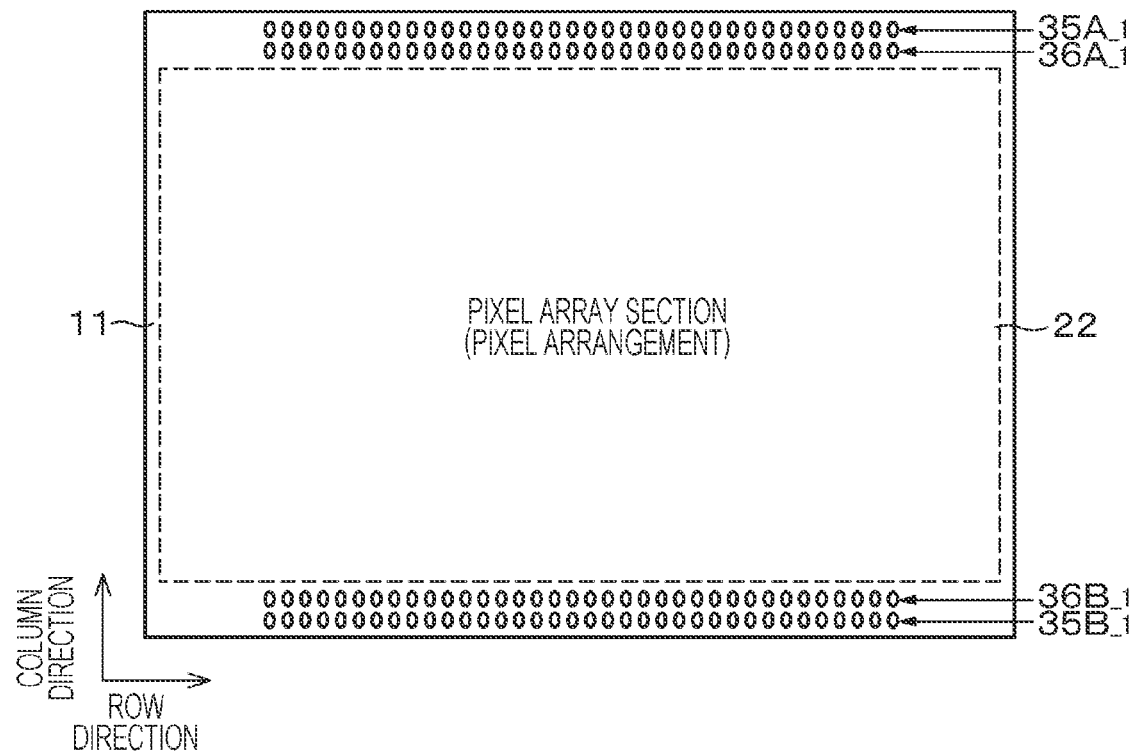
FIGS. 11A and 11B are diagrams illustrating a stacked chip structure according to Example 2.
Figure 11B:
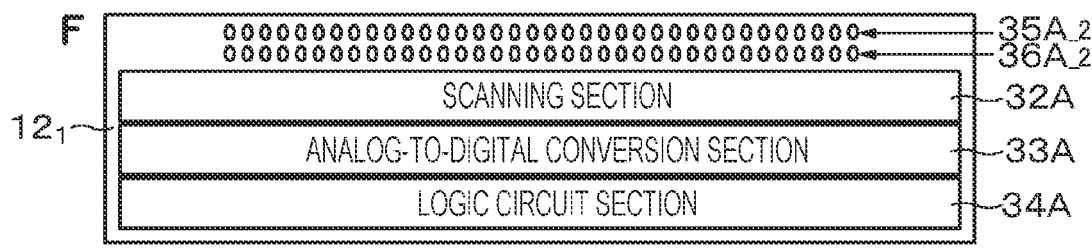
Figure 11B:
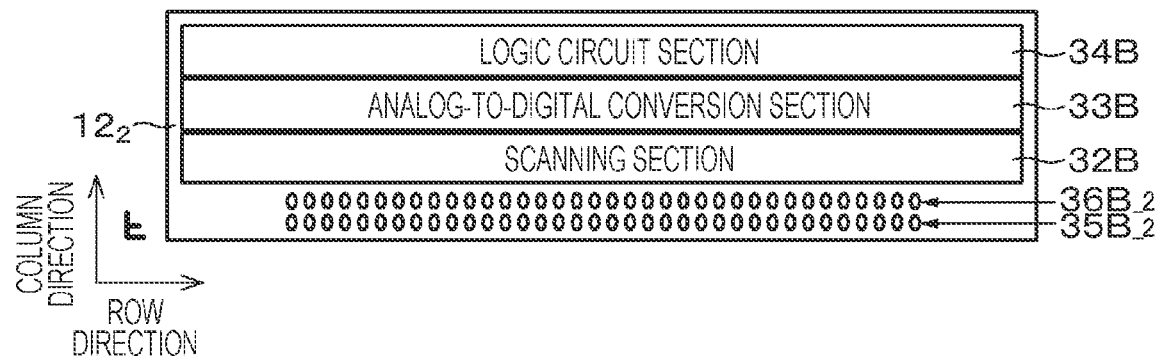

Example 2 is an example in which the second semiconductor chips 12 are arranged at opposite end portions of the first semiconductor chip 11 in the column direction (top-bottom direction/vertical direction). FIGS. 11A and 11B are diagrams illustrating a stacked chip structure according to Example 2, FIG. 11A illustrates an outline of a configuration of the first semiconductor chip, and FIG. 11B illustrates an outline of a configuration of the second semiconductor chip.

In the stacked chip structure according to Example 2, the second semiconductor chip 12 is constituted by two chips, a chip $12_1$ and a chip $12_2$, and the chip $12_1$ and the chip $12_2$ are arranged at both of upper and lower end portions of the first semiconductor chip 11 in the column direction (vertical direction), respectively. Further, the connection portions $35A_{-1}$ and $35B_{-1}$ of the pixel control line 41 and the connection portions $36A_{-1}$ and $36B_{-1}$ of the vertical signal line 42 are arranged side by side, respectively, and are provided along the row direction on both the upper and lower sides of the first semiconductor chip 11. Further, the connection portion $35A_{-2}$ of the pixel control line 41 and the connection portion $36A_{-2}$ of the vertical signal line 42 are arranged side by side and provided along the row direction in the chip $12_1$, and the connection portion $35B_{-2}$ of the pixel control line 41 and the connection portion $36B_{-2}$ of the vertical signal line 42 are arranged side by side and provided along the row direction in the chip $12_2$.

The scanning section 32A is arranged on the chip $12_1$ of the second semiconductor chip 12 along the row direction (pixel row) of the pixel array section 22, together with the analog-to-digital conversion section 33A and the logic circuit section 34A. The scanning section 32B is arranged on the chip $12_2$ of the second semiconductor chip 12 along the row direction of the pixel array section 22, together with the analog-to-digital conversion section 33B and the logic circuit section 34B. The scanning section 32A, the analog-to-digital conversion section 33A, and the logic circuit section 34A of the chip $12_1$, and the scanning section 32B, the analog-to-digital conversion section 33B, and the logic circuit section 34B of the chip $12_2$ have a vertical-mirror-symmetrical relationship.

As described above, in the stacked chip structure according to Example 2, the second semiconductor chip 12 including the scanning sections 32A and 32B arranged along the pixel rows is constituted by two chips including the chip $12_1$ and the chip $12_2$ arranged at both of the upper and lower end portions (on both sides) of the first semiconductor chip 11. In the stacked chip structure according to Example 2, a signal of the pixel 21 can be read on both the upper and lower sides of the first semiconductor chip 11, and thus, the stacked chip structure according to Example 2 is suitable as a stacked chip structure for a high-speed image capturing device.

Also in Example 2, the wiring of the pixel control line 41 and the vertical signal line 42 on the first semiconductor chip 11, and the connection between the first semiconductor chip 11 and the second semiconductor chip 12 can be basically similar to those of Example 1 illustrated in FIG. 7. Furthermore, the TSV illustrated in FIG. 8A or the Cu—Cu connection illustrated in FIG. 8B can be applied as the connection portion that electrically connects the first semiconductor chip 11 and the second semiconductor chip 12.

EXAMPLE 3

Figure 12A:
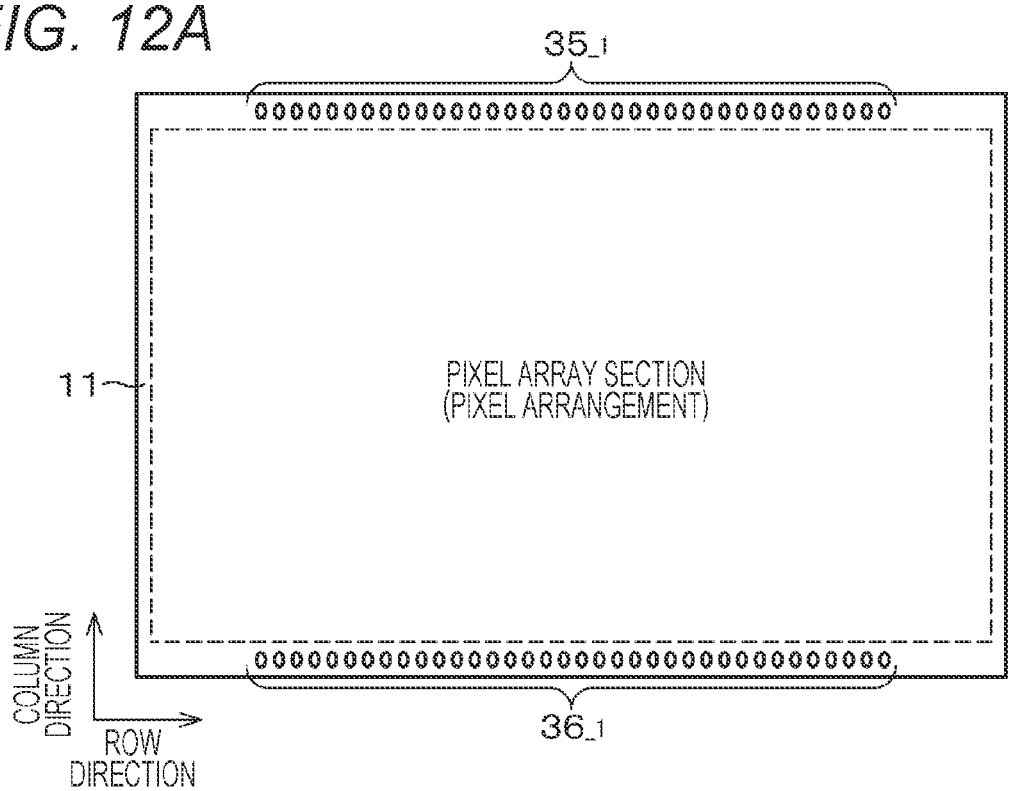
FIGS. 12A and 12B are diagrams illustrating a stacked chip structure according to Example 3.
Figure 12B:
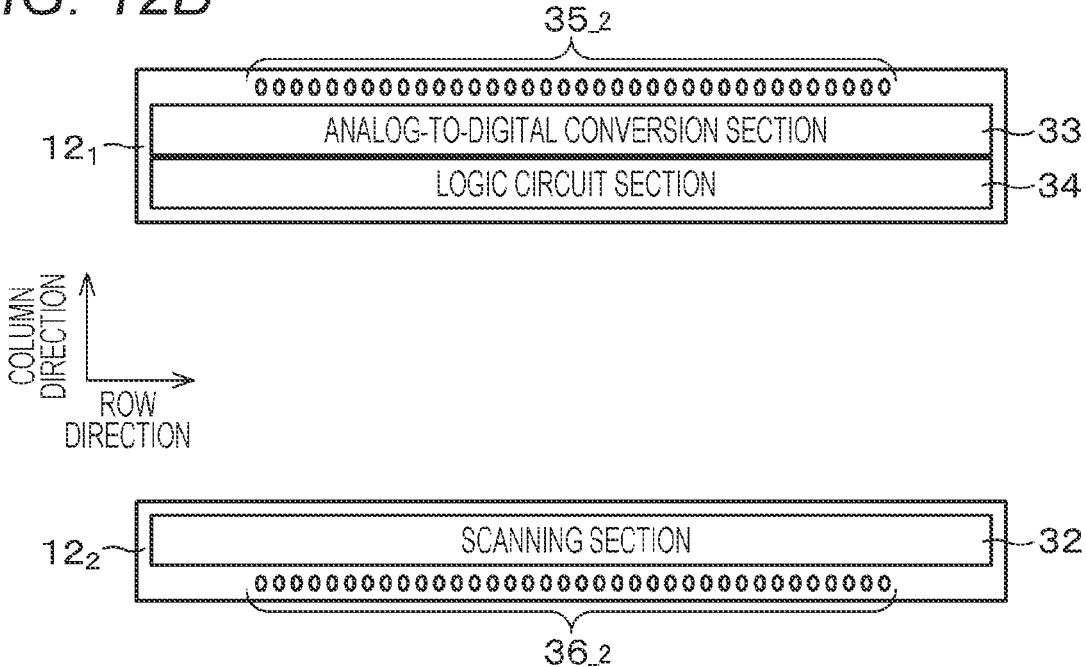

Example 3 is an example in which the second semiconductor chip 12 is constituted by two chips and the scanning section 32 is an independent chip. FIGS. 12A and 12B are diagrams illustrating a stacked chip structure according to Example 3, FIG. 12A illustrates an outline of a configuration of the first semiconductor chip, and FIG. 12B illustrates an outline of a configuration of the second semiconductor chip.

In the stacked chip structure according to Example 3, the second semiconductor chip 12 is constituted by two chips, the chip $12_1$ and the chip $12_2$, and the chip $12_1$ and the chip $12_2$ are arranged on both the upper and lower sides of the first semiconductor chip 11 in the column direction (vertical direction), respectively. Further, the connection portion $35A_{-1}$ and the connection portion $35A_{-2}$ of the pixel control line 41 are provided on one side (the upper side in the drawing) of the first semiconductor chip 11 and the chip $12_1$, respectively, along the row direction. The connection portion $36A_{-1}$ and the connection portion $36A_{-2}$ of the vertical signal line 42 are provided on the other side (the lower side in the drawing) of the first semiconductor chip 11 and the chip $12_2$, respectively, along the row direction.

The analog-to-digital conversion section 33A and the logic circuit section 34A are arranged on the chip $12_1$ of the second semiconductor chip 12 along the row direction of the pixel array section 22. The scanning section 32B is arranged on the chip $12_2$ of the second semiconductor chip 12 along the row direction of the pixel array section 22.

As described above, in the stacked chip structure according to Example 3, the second semiconductor chip 12, which is a circuit chip, is constituted by two chips including the chip $12_1$ for the analog-to-digital conversion section 33/logic circuit section 34 and the chip $12_2$ for the scanning section 32. With the stacked chip structure according to Example 3, the process for the chip $12_1$ for the analog-to-digital conversion section 33/logic circuit section 34 and the process for the chip $12_2$ for the scanning section 32 can be individually optimized. For example, as for the chip $12_1$, the analog-to-digital conversion section 33/logic circuit section 34 can be implemented with a low-noise and low-voltage process, and the chip $12_2$ for the scanning section 32 can be implemented with a process optimized for ensuring pixel characteristics (for example, a saturation charge amount $Q_s$ and a transfer).

Also in Example 3, the wiring of the pixel control line 41 and the vertical signal line 42 on the first semiconductor chip 11, and the connection between the first semiconductor chip 11 and the second semiconductor chip 12 can be basically similar to those of Example 1 illustrated in FIG. 7. Furthermore, the TSV illustrated in FIG. 8A or the Cu—Cu connection illustrated in FIG. 8B can be applied as the connection portion that electrically connects the first semiconductor chip 11 and the chips $12_1$ and $12_2$ of the second semiconductor chip 12.

EXAMPLE 4

Figure 13A:
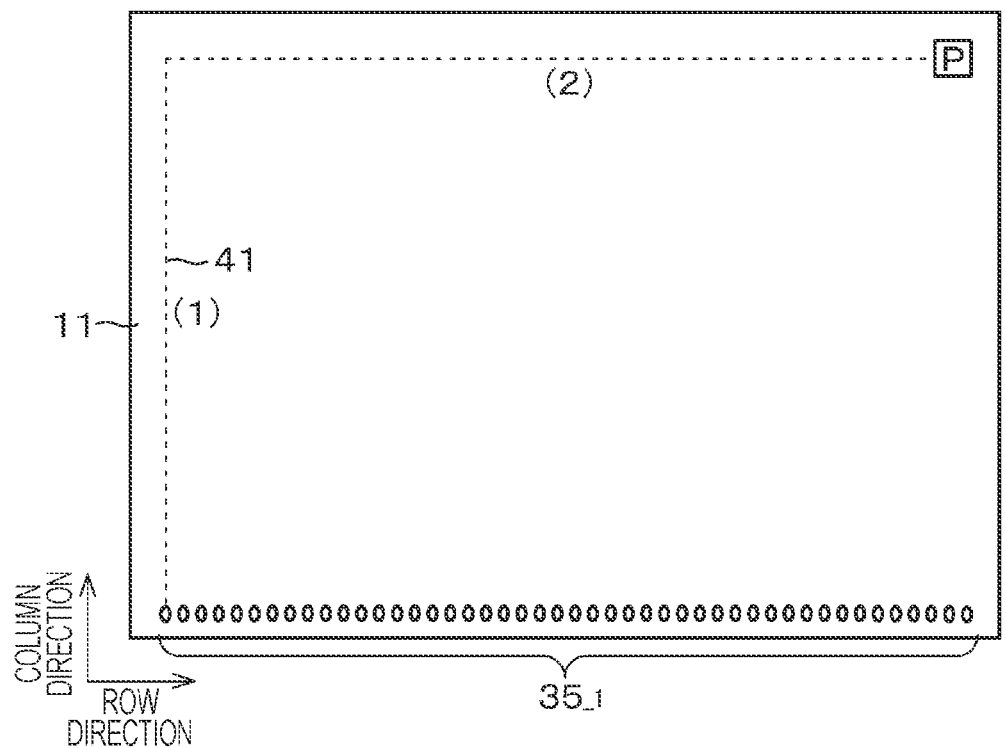
FIGS. 13A and 13B are diagrams illustrating a stacked chip structure according to Example 4.
Figure 13B:
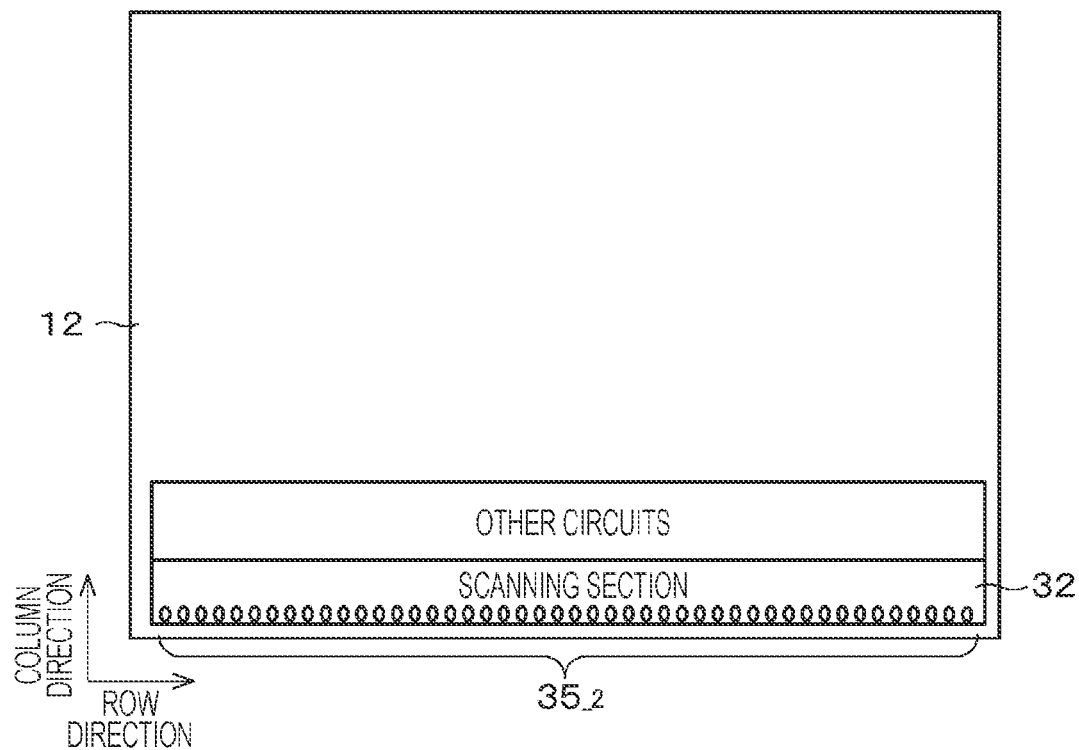

Example 4 is an example in which the scanning section 32 is arranged at an end portion of the second semiconductor chip 12 in the column direction. FIGS. 13A and 13B are diagrams illustrating a stacked chip structure according to Example 4, FIG. 13A illustrates an outline of a configuration of the first semiconductor chip, and FIG. 13B illustrates an outline of a configuration of the second semiconductor chip.

In the stacked chip structure according to Example 4, the scanning section 32 is arranged at one end portion (for example, a lower end portion in the drawing) of the second semiconductor chip 12 in the column direction (vertical direction/top-bottom direction) along the pixel rows. Other circuits such as the analog-to-digital conversion section 33 are arranged on the inner side than the scanning section 32.

In the stacked chip structure according to Example 4, a path of the pixel control line 41 toward a pixel P farthest from the output end of the scanning section 32 is constituted by a path (1) wired along the column direction of the pixel arrangement and a path (2) wired along the row direction.

Also in Example 4, the wiring of the pixel control line 41 and the vertical signal line 42 on the first semiconductor chip 11, and the connection between the first semiconductor chip 11 and the second semiconductor chip 12 can be basically similar to those of Example 1 illustrated in FIG. 7. Furthermore, the TSV illustrated in FIG. 8A or the Cu—Cu connection illustrated in FIG. 8B can be applied as the connection portion that electrically connects the first semiconductor chip 11 and the second semiconductor chip 12.

EXAMPLE 5

Figure 14A:
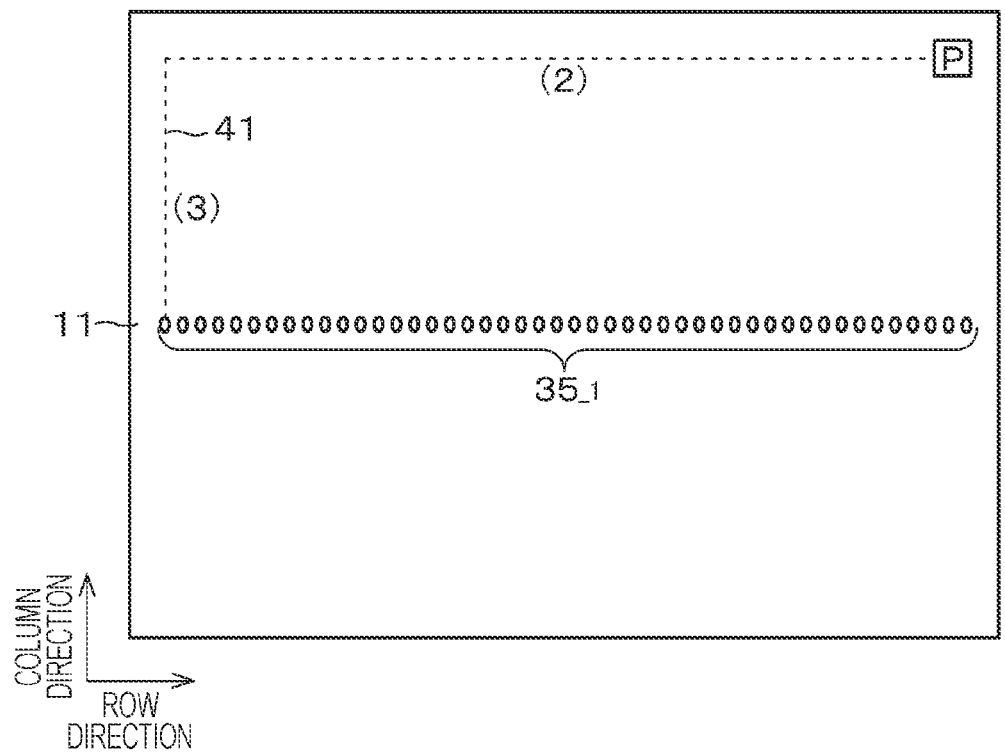
FIGS. 14A and 14B are diagrams illustrating a stacked chip structure according to Example 5.
Figure 14B:
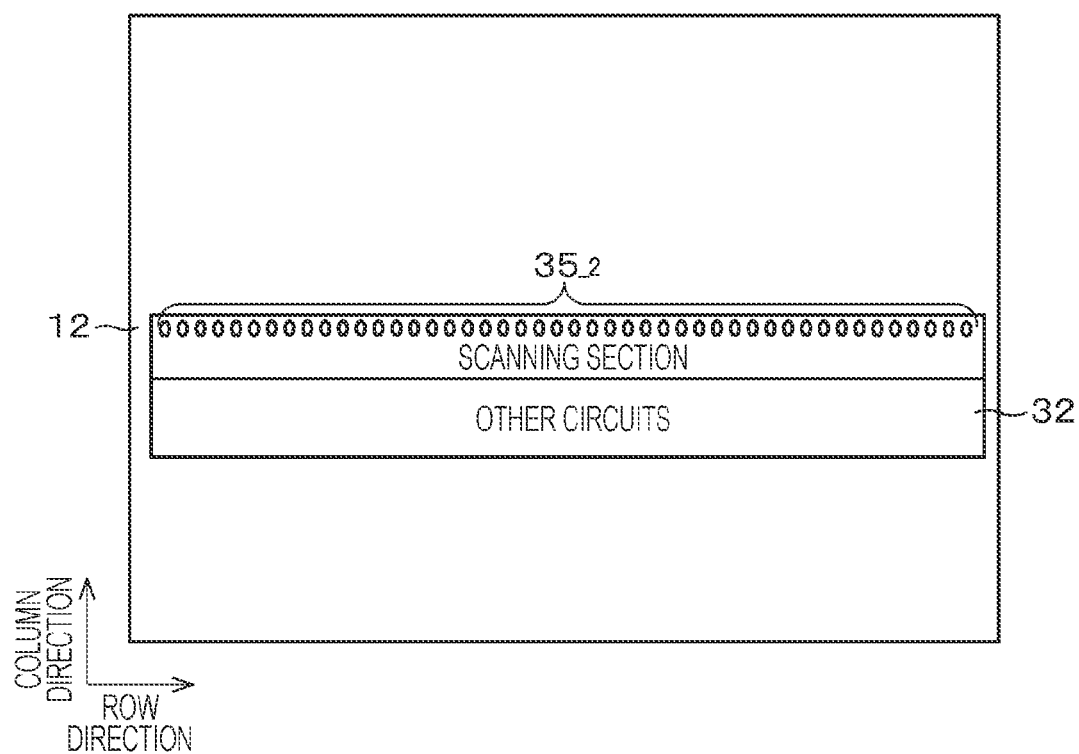

Example 5 is a modification of Example 4, and is an example in which the scanning section 32 is arranged at a central portion of the second semiconductor chip 12 in the column direction. FIGS. 14A and 14B are diagrams illustrating a stacked chip structure according to Example 5, FIG. 14A illustrates an outline of a configuration of the first semiconductor chip, and FIG. 14B illustrates an outline of a configuration of the second semiconductor chip.

In the stacked chip structure according to Example 5, the scanning section 32 is arranged at a central portion of the second semiconductor chip 12 in the column direction (vertical direction/top-bottom direction) along the pixel rows. Other circuits such as the analog-to-digital conversion section 33 are arranged on one side (for example, the lower side in the drawing) of the scanning section 32 in the column direction.

Also in Example 5, the wiring of the pixel control line 41 and the vertical signal line 42 on the first semiconductor chip 11, and the connection between the first semiconductor chip 11 and the second semiconductor chip 12 can be basically similar to those of Example 1 illustrated in FIG. 7. However, in the stacked chip structure according to Example 5, the connection portions $35A_{-1}$ and $35A_{-2}$ of the pixel control line 41 are arranged at a central portion in the region of the pixel arrangement, and thus, the Cu—Cu connection illustrated in FIG. 8B is applied as the connection portions $35A_{-1}$ and $35A_{-2}$ of the pixel control line 41.

In the stacked chip structure according to Example 5, a path of the pixel control line 41 toward a pixel P farthest from the output end of the scanning section 32 is constituted by a path (3) wired along the column direction of the pixel arrangement and the path (2) wired along the row direction. Since the path (3) is shorter than the path (1) in Example 4, a propagation delay of a signal transmitted through the pixel control line 41 can be made shorter than that in Example 4.

EXAMPLE 6

Figure 15A:
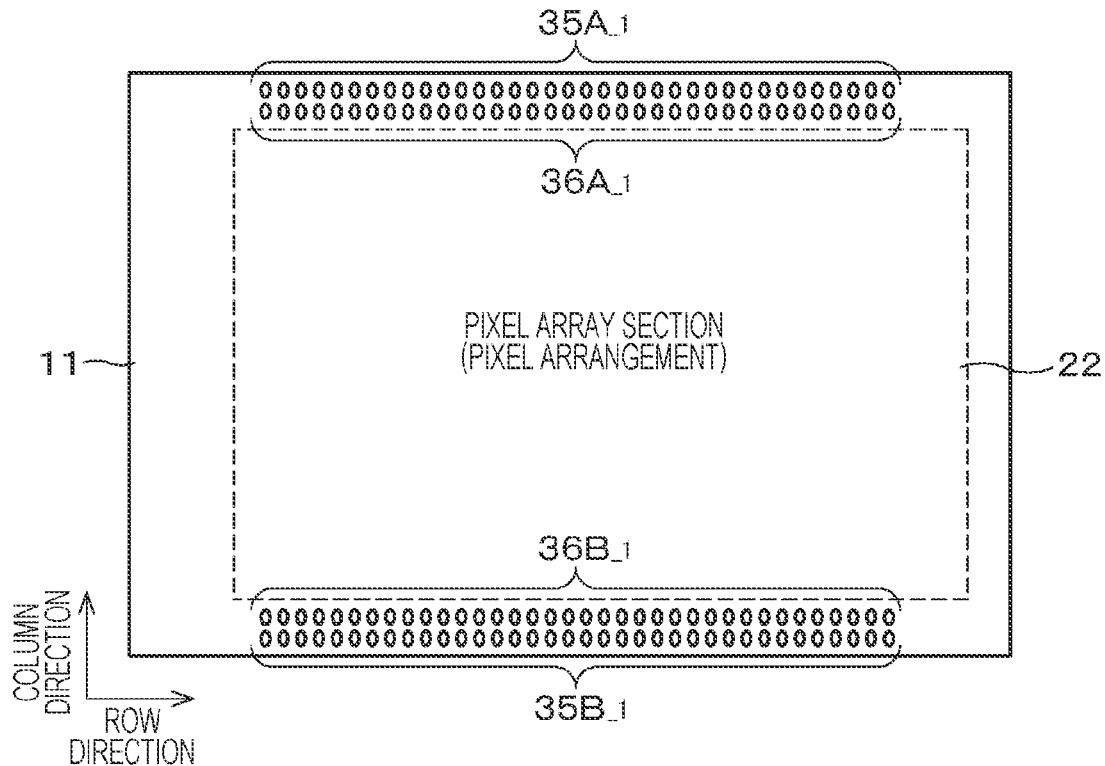
FIGS. 15A and 15B are diagrams illustrating a stacked chip structure according to Example 6.
Figure 15B:
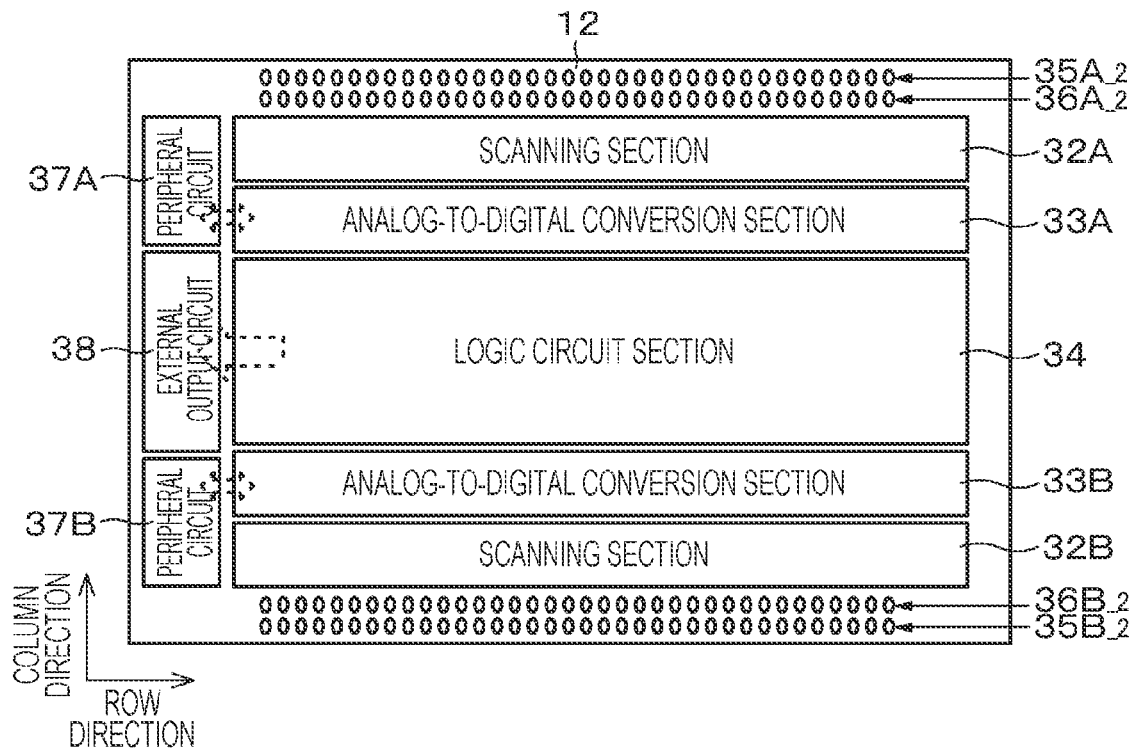

Example 6 is an example in which the peripheral circuit and the like are arranged at an end portion of the second semiconductor chip 12 in the row direction. FIGS. 15A and 15B are diagrams illustrating a stacked chip structure according to Example 6, FIG. 15A illustrates an outline of a configuration of the first semiconductor chip, and FIG. 15B illustrates an outline of a configuration of the second semiconductor chip.

In the stacked chip structure according to Example 6, the scanning sections 32A and 32B and the analog-to-digital conversion sections 33A and 33B are arranged so as to be vertical-mirror-symmetrical at opposite end portions of the second semiconductor chip 12 in the column direction, the logic circuit section 34 is arranged at the central portion, and peripheral circuits 37A and 37B and an external output circuit 38 are arranged at one end portion in the row direction. The analog peripheral circuits 37A and 37B are peripheral circuits such as PLLs or reference current/voltage generation circuits. The external output circuit 38 is an output circuit such as an LVDS/MIPI that outputs data to the outside.

With the stacked chip structure according to Example 6, in a case where the analog peripheral circuits 37A and 37B and the external output circuit 38 are arranged at one end portion in the row direction, the scanning sections 32A and 32B are arranged along the pixel rows. As a result, the arrangement positions of the blocks that require communication are close to each other. Specifically, there is no circuit block that interferes with wiring between the logic circuit section 34 and the external output circuit 38, and between the analog-to-digital conversion sections 33A and 33B and the analog peripheral circuits 37A and 37B. Therefore, the layout or timing design of the circuit block becomes easy.

Also in Example 6, the wiring of the pixel control line 41 and the vertical signal line 42 on the first semiconductor chip 11, and the connection between the first semiconductor chip 11 and the second semiconductor chip 12 can be basically similar to those of Example 1 illustrated in FIG. 7. Furthermore, the TSV illustrated in FIG. 8A or the Cu—Cu connection illustrated in FIG. 8B can be applied as the connection portion that electrically connects the first semiconductor chip 11 and the second semiconductor chip 12.

Example 7

Example 7 is an example in which wiring parasitic capacitance coupling between the pixel control line 41 and the vertical signal line 42 is dispersed.

Figure 16A:
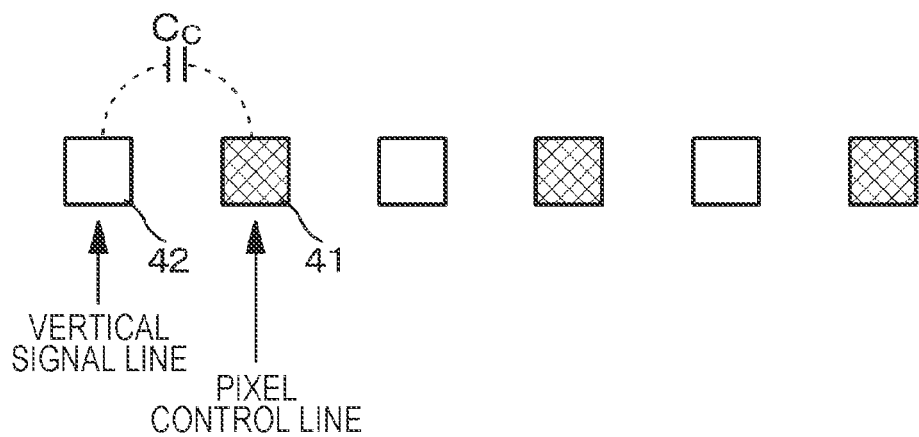
FIGS. 16A and 16B are diagrams illustrating a wiring parasitic capacitance generated between the pixel control line and the vertical signal line.
Figure 16B:
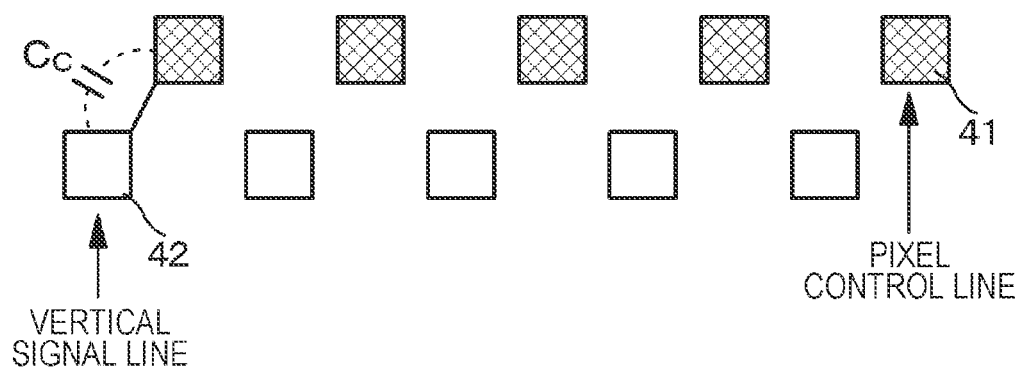

In a case where the pixel control line 41 is laid out along the column direction in the same manner as the vertical signal line 42 as illustrated in FIG. 7, a wiring parasitic capacitance $C_c$ is formed between the pixel control line 41 and the vertical signal line 42 as illustrated in FIGS. 16A and 16B. FIG. 16A illustrates a wiring parasitic capacitance $C_c$ in a case where the pixel control line 41 and the vertical signal line 42 are laid out on the same metal layer, and FIG. 16B illustrates a wiring parasitic capacitance $C_c$ in a case where the pixel control line 41 and the vertical signal line 42 are laid out on different metal layers, respectively.

Figure 17A:
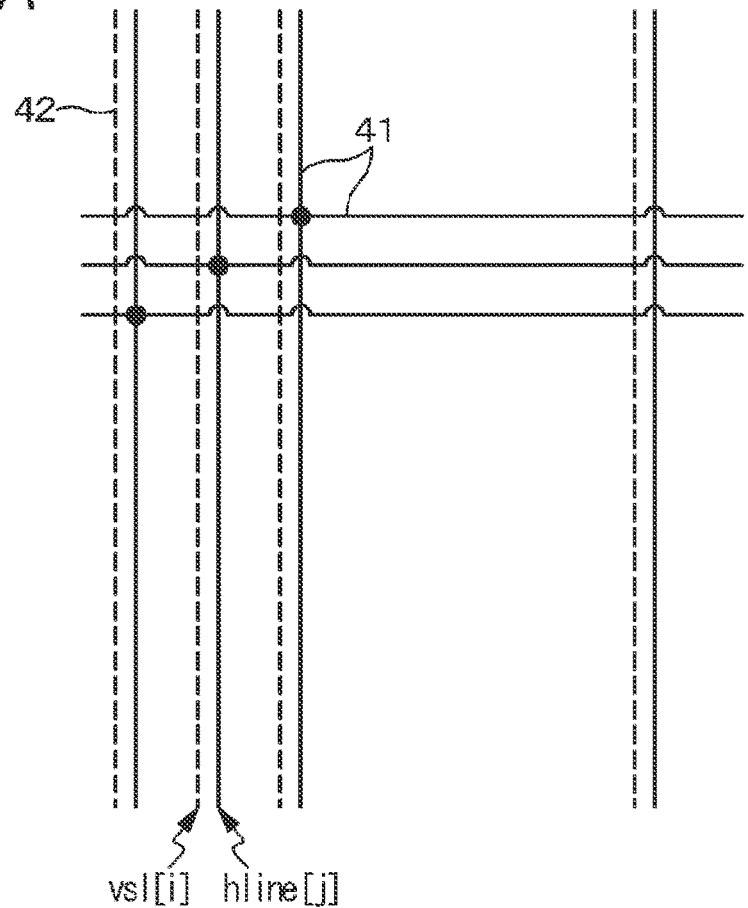
FIGS. 17A and 17B are diagrams for describing a defect caused by wiring parasitic capacitance coupling.
Figure 17B:
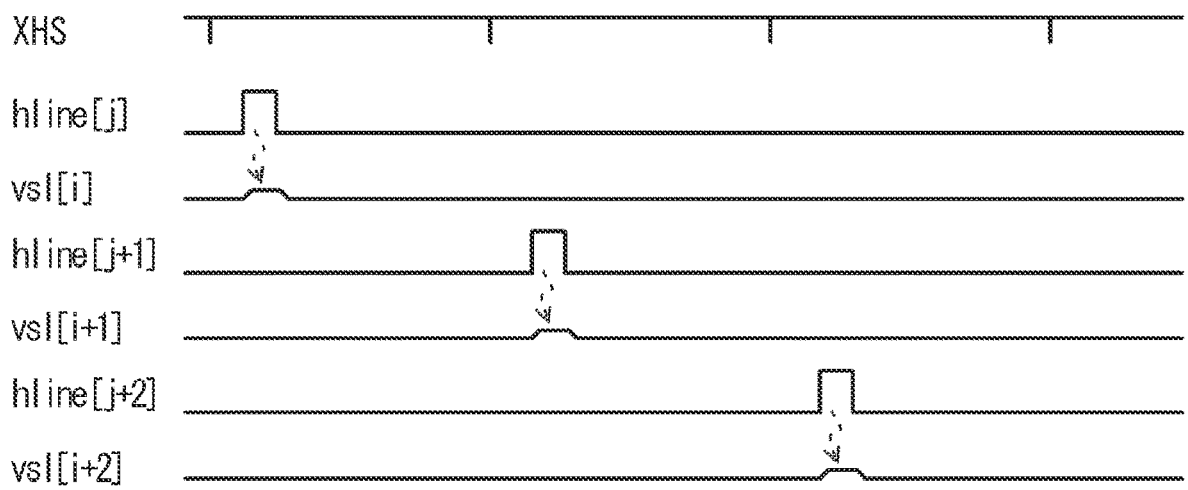

As illustrated in FIGS. 17A and 17B, when a certain pixel row is accessed, the potential of the pixel control line 41 that controls the pixel row transitions. At this time, the potential of the vertical signal line 42 running in parallel with the corresponding pixel control line 41 in the column direction is fluctuated by the coupling of the wiring parasitic capacitance $C_c$. As a result, in a case where the fluctuation of the potential of the vertical signal line 42 does not subside during the analog-to-digital conversion, an error occurs in the analog-to-digital conversion result. Then, the position of the pixel in which the error occurs in the column direction is gradually shifted depending on the pixel row. As a result, the error appears as oblique fixed pattern noise (FPN) in an output image.

In order to deal with the above-described problem, in the stacked chip structure according to Example 7, the path of the pixel control line 41 in the column direction (corresponding to the path (1) in FIG. 13A) is laid out, not in a linear vertical wiring shape, but in a wiring shape shifted in the row direction (horizontal direction) by a predetermined amount with a predetermined length as a unit.

Figure 18:
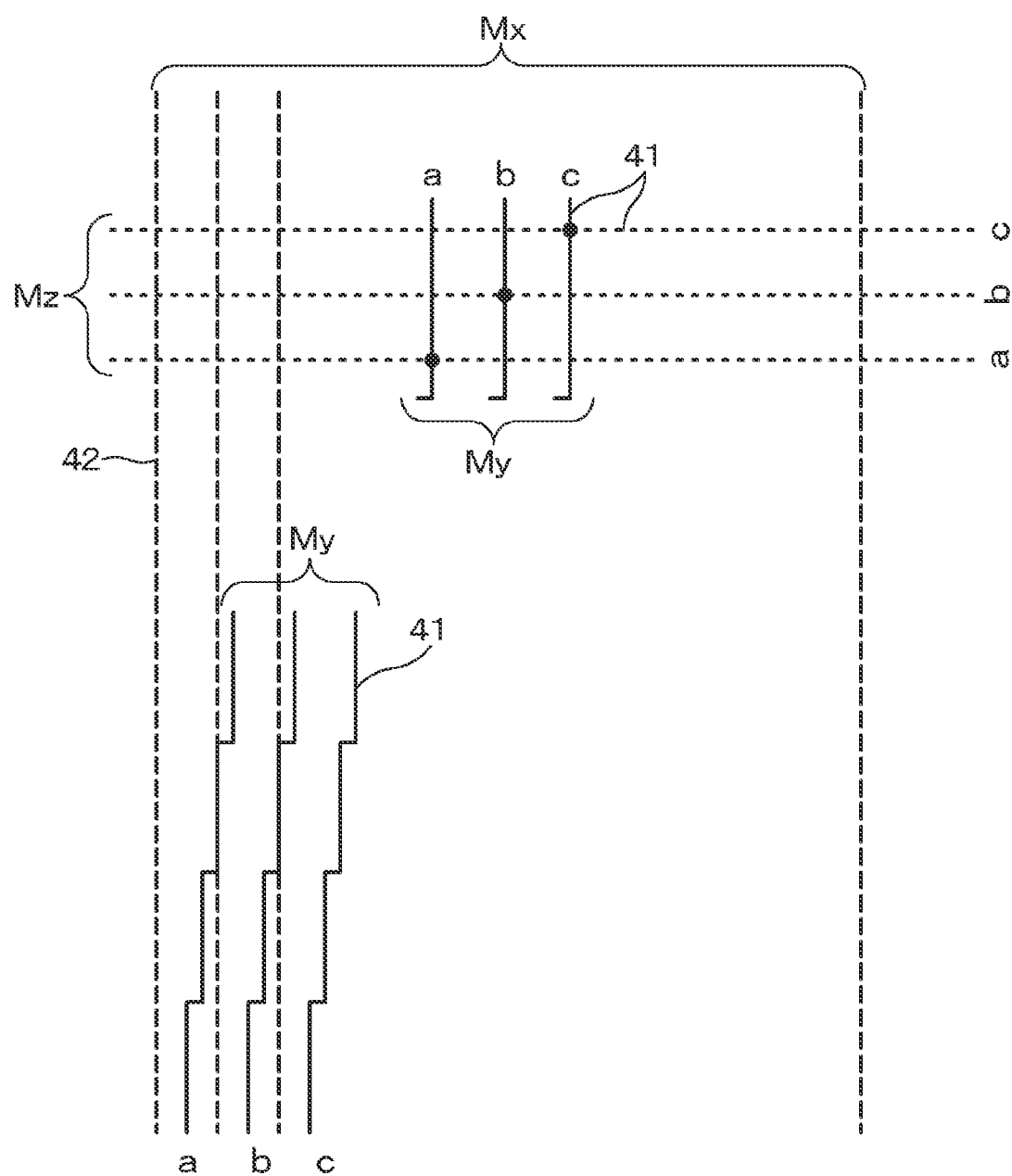
FIG. 18 is a diagram illustrating a wiring shape example 1 of a path of a pixel control line in a column direction in a stacked chip structure according to Example 7.
Figure 19:
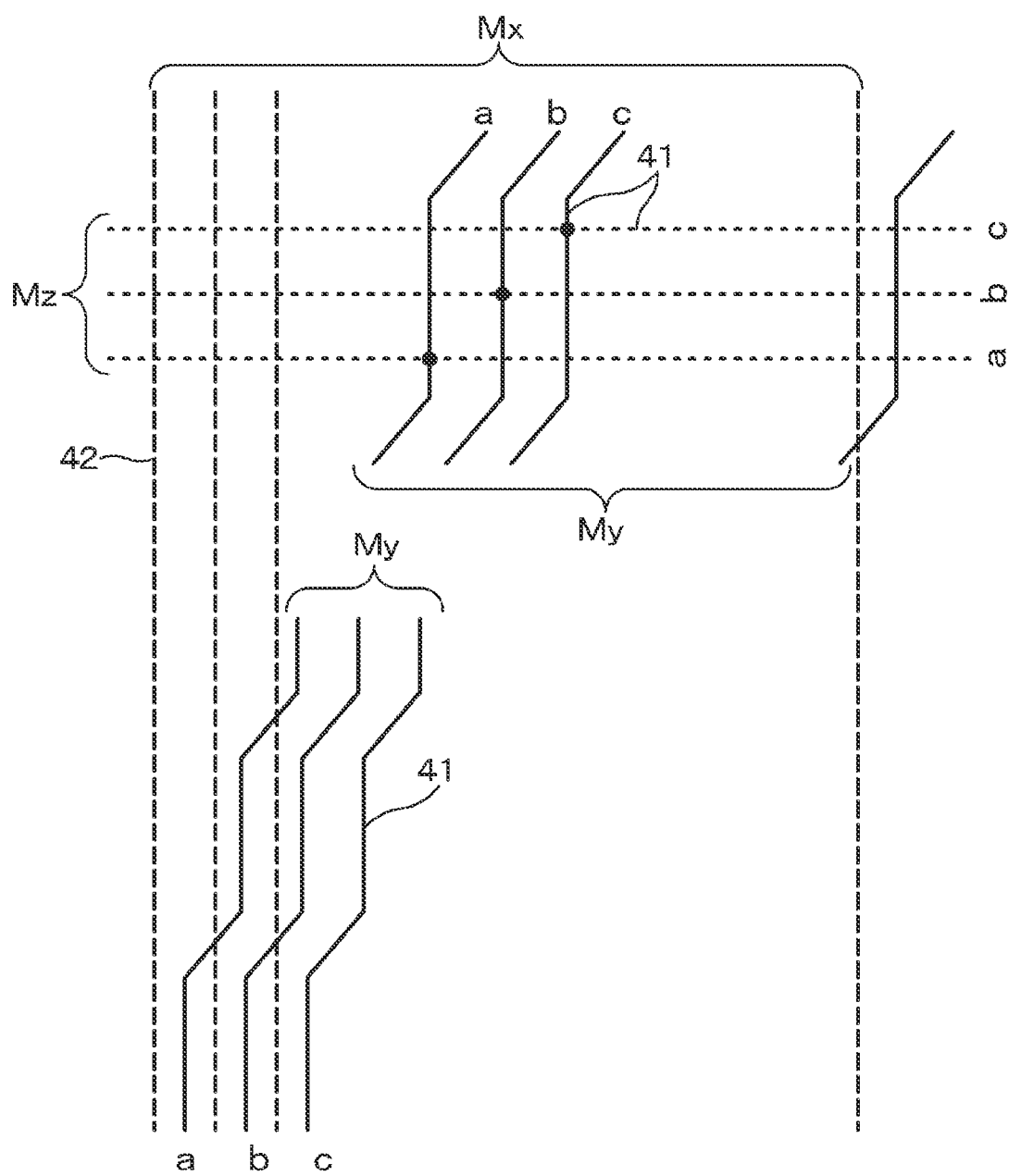
FIG. 19 is a diagram illustrating a wiring shape example 2 of the path of the pixel control line in the column direction in the stacked chip structure according to Example 7.
Figure 20:
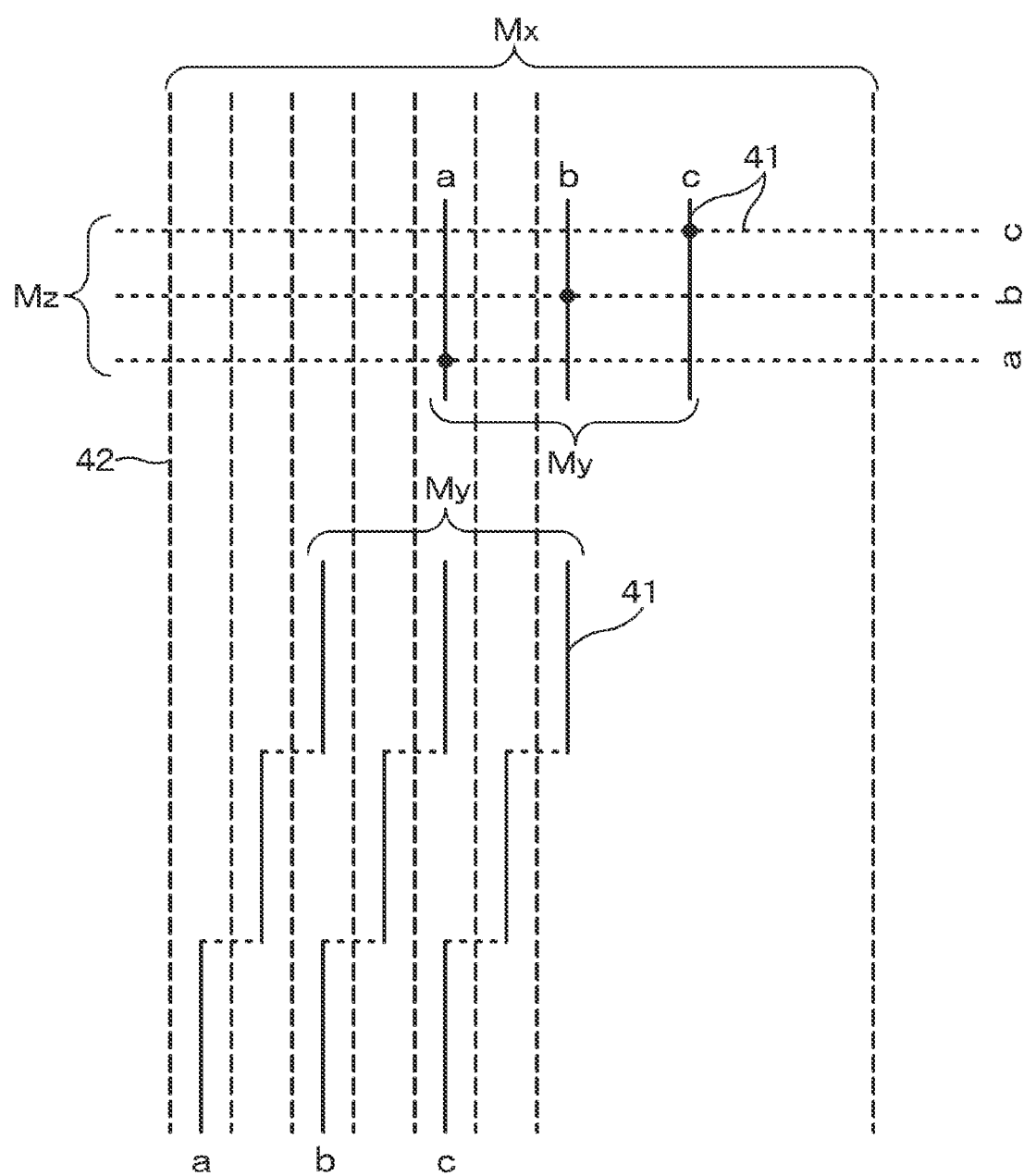
FIG. 20 is a diagram illustrating a wiring shape example 3 of the path of the pixel control line in the column direction in the stacked chip structure according to Example 7.

An example of the wiring shape of the path (wiring) of the pixel control line 41 in the column direction in the stacked chip structure according to Example 7 will be described with reference to FIGS. 18, 19, and 20. FIG. 18 illustrates a wiring shape example 1 of the path of the pixel control line 41 in the column direction, FIG. 19 illustrates a wiring shape example 2 of the path of the pixel control line 41 in the column direction, and FIG. 20 illustrates a wiring shape example 3 of the path of the pixel control line 41 in the column direction.

(Wiring Shape Example 1)

As illustrated in FIG. 18, in the wiring shape example 1, the vertical signal line 42 and the path (wiring) of the pixel control line 41 in the column direction are laid out on separate metal layers, respectively. The metal layer on which the vertical signal line 42 is laid out is referred to as a first metal layer Mx, and the metal layer on which the path of the pixel control line 41 in the column direction is laid out is referred to as a second metal layer My. Moreover, the path (wiring) of the pixel control line 41 in the row direction is laid out on a third metal layer Mz different from the first and second metal layers Mx and My. The shift of the path of the pixel control line 41 in the column direction is realized by the wiring in the row direction on the second metal layer My.

(Wiring Shape Example 2)

As illustrated in FIG. 19, in a wiring shape example 2, similarly to the wiring shape example 1, the vertical signal line 42 and the path of the pixel control line 41 in the column direction are separately laid out on the first metal layer Mx and the second metal layer My, respectively, and the path of the pixel control line 41 in the row direction is laid out on the third metal layer Mz different from the first and second metal layers Mx and Mz. The shift of the path of the pixel control line 41 in the column direction is realized by the wiring in the diagonal direction on the second metal layer My. In the wiring shape example 2, the interval between the paths (vertical wires) of the pixel control line 41 in the column direction can be smaller than in the wiring shape example 1, which is advantageous when the wiring density is high.

(Wiring Shape Example 3)

As illustrated in FIG. 20, in a wiring shape example 3, in a case where the density of the paths (vertical wires) of the pixel control line 41 in the column direction is not so high, the vertical signal line 42 and the path of the pixel control line 41 in the column direction are laid out on the same metal layer, for example, the first metal layer Mx. Then, the path of the pixel control line 41 in the row direction is laid out on the separate second metal layer My. The shift of the path of the pixel control line 41 in the column direction is realized by the wiring in the row direction (or the diagonal direction) on the second metal layer My. In the wiring shape example 3, the number of wiring layers (metal layers) can be smaller by one than those in the wiring shape examples 1 and 2.

As described above, in the stacked chip structure according to Example 7, the wiring of the path of the pixel control line 41 in the column direction is laid out in a wiring shape shifted in the row direction by a predetermined amount and laid out with a predetermined length as a unit. Therefore, as for the vertical signal line 42 to be coupled with a certain pixel control line 41, the coupling is not concentrated on any one vertical signal line 42, but is dispersed over a plurality of vertical signal lines 42 (coupling dispersion), and thus, the amount of coupling and its influence are reduced.

Note that, in Example 7, the layout pattern in which the vertical signal line 42 is linearly wired and the path of the pixel control line 41 in the column direction is shifted by a predetermined amount in the row direction is described by way of example, but a layout pattern in which the path of the pixel control line 41 in the column direction is linearly wired and the vertical signal line 42 is shifted by a predetermined amount in the row direction is also possible under a similar concept. With this layout pattern, a similar coupling dispersion effect can be obtained.

Example 8

Example 8 is an example showing variations of a connection relationship between the paths of the pixel control line 41 in the column direction and the row direction. Variation 1 is illustrated in FIG. 21A, Variation 2 is illustrated in FIG. 21B, Variation 3 is illustrated in FIG. 21C, Variation 4 is illustrated in FIG. 22A, and Variation 5 is illustrated in FIG. 22B.

(Variation 1)

Figure 21A:
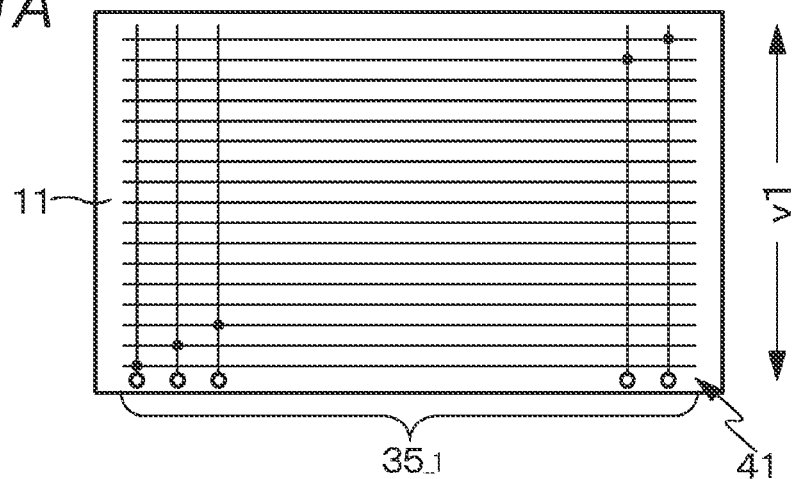
FIGS. 21A, 21B, and 21C are diagrams (Part 1) illustrating a connection relationship between paths of the pixel control line in the column direction and a row direction.
Figure 21B:
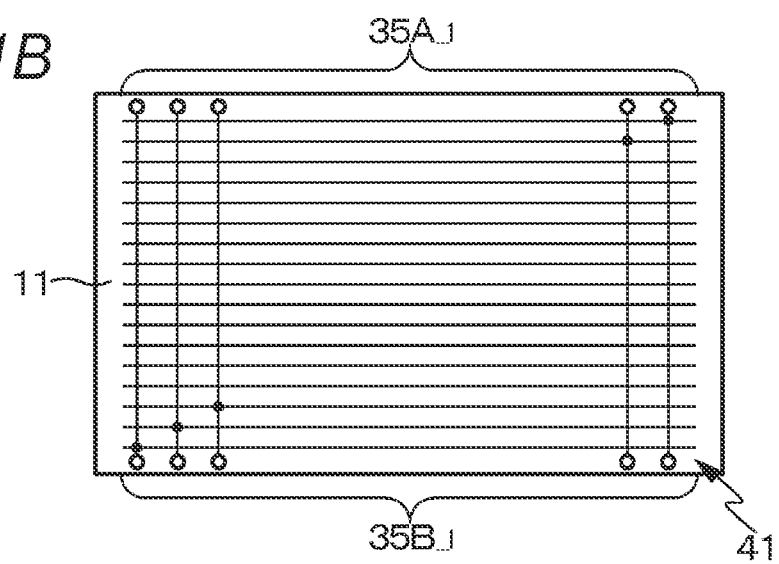
Figure 21C:
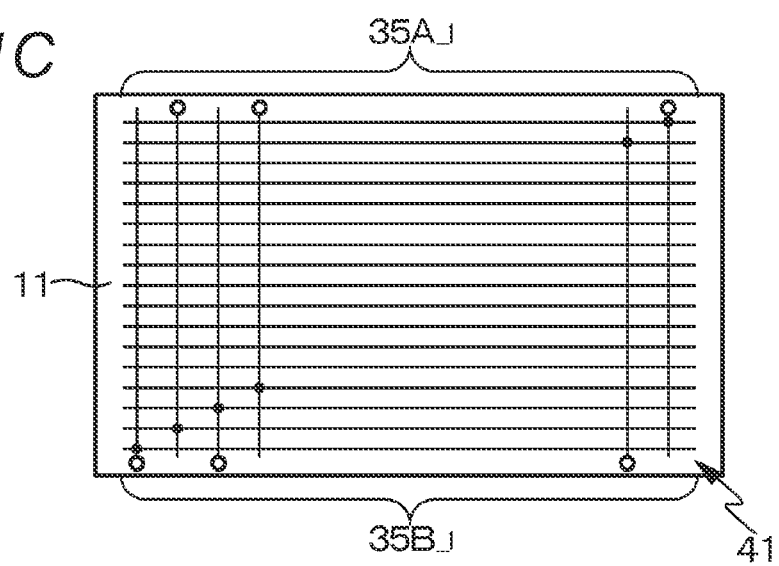
Figure 22A:
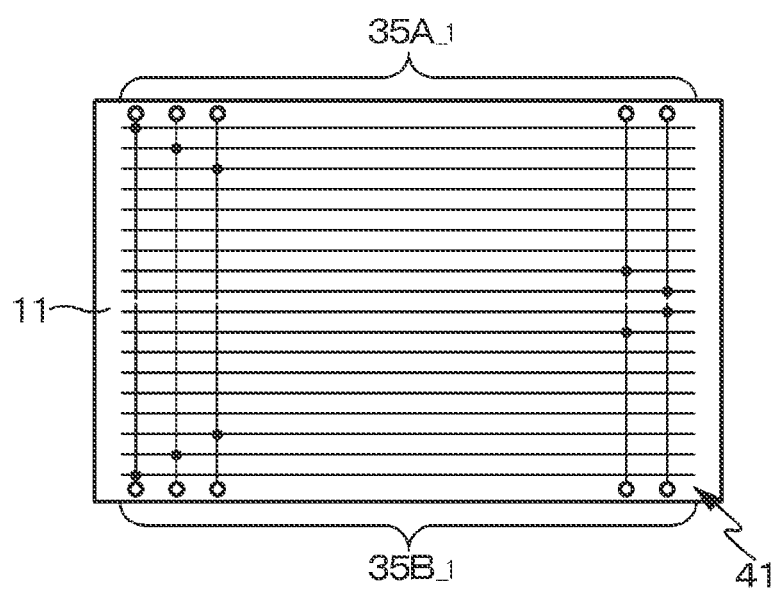
FIGS. 22A and 22B are diagrams (Part 2) illustrating the connection relationship between the paths of the pixel control line in the column direction and the row direction.
Figure 22B:
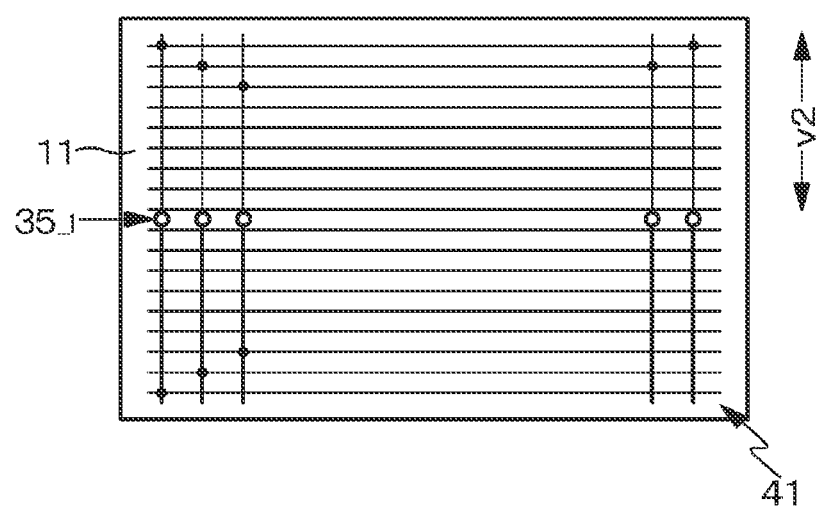

Variation 1 illustrated in FIG. 21A is the connection relationship between the paths of the pixel control line 41 in the column direction and the row direction in a case where the scanning section 32 is arranged on one side (the lower side in this example) in the column direction (top-bottom direction). The connection portion 351 of the pixel control line 41 is arranged on the first semiconductor chip 11, corresponding to the output end of the scanning section 32. In FIG. 21A, a black circle (•) is a contact portion between the path in the column direction and the path in the row direction. This point also applies to Variations 2 to 5 as described later.

(Variation 2)

Variation 2 illustrated in FIG. 21B is the connection relationship between the paths of the pixel control line 41 in the column direction and the row direction in a case where the scanning section 32 is arranged on each of opposite sides in the column direction (top-bottom direction). The path of the pixel control line 41 in the column direction is electrically connected to the output ends of the scanning sections 32 arranged on both the upper and lower sides through the connection portions $35A_{-1}$ and $35B_{-1}$ of the pixel control line 41. In a case where the scanning sections 32 are arranged on opposite sides in the column direction (top-bottom direction), the driving capability of the pixel control line 41 is doubled, and thus, the potential of the pixel control line 41 transitions at a high speed.

(Variation 3)

Variation 3 illustrated in FIG. 21C is the connection relationship between the paths of the pixel control line 41 in the column direction and the row direction in a case where the scanning section 32 is arranged on each of opposite sides in the column direction, and the paths of the pixel control line 41 in the column direction are alternately and electrically connected to the output ends of the scanning sections 32 arranged on both the upper and lower sides. In Variation 3, it is sufficient that the number of units of the scanning sections 32 arranged on both the upper and lower sides is half of those in Variation 1 and Variation 2.

(Variation 4)

Variation 4 illustrated in FIG. 22A is the connection relationship between the paths of the pixel control line 41 in the column direction and the row direction in a case where the scanning section 32 is arranged on each of opposite sides in the column direction, and the path of the pixel control line 41 in the column direction is cut off at a central portion of the chip. The path that is arranged on the upper side of the chip and is cut off at the central portion of the chip is electrically connected to the output end of the scanning section 32 arranged on the upper side of the chip, and the path that is arranged on the lower side of the chip is electrically connected to the output end of the scanning section 32 arranged on the lower side of the chip. In Variation 4, the length of the path of the pixel control line 41 in the column direction is halved, and thus, the potential of the pixel control line 41 transitions at a high speed. Furthermore, it is sufficient that the number of units of the scanning sections 32 arranged on both the upper and lower sides is half of those in Variation 1 and Variation 2.

(Variation 5)

Variation 5 illustrated in FIG. 22B is the connection relationship between the paths of the pixel control line 41 in the column direction and the row direction in a case where the scanning section 32 is arranged at a central portion of the chip in the column direction (corresponding to the example in FIGS. 14A and 14B). In Variation 5, the distance from the connection portions 35A_1 and 35B_1 of the pixel control line 41 to the end of the path of the pixel control line 41 in the column direction is half of that in Variation 1, such that the potential of the pixel control line 41 transitions at a high speed.

Modified Example

The technology according to the present disclosure has been described above on the basis of the preferred embodiment, but the technology according to the present disclosure is not limited to the embodiment. The configuration and structure of the image capturing device described in the above-described embodiment are examples, and can be changed as appropriate.

For example, although a CMOS image sensor in which the pixels 2 are arranged in a matrix form has been described as an example in the above-described embodiment, the technology according to the present disclosure is not limited to the application to the CMOS image sensor. That is, the technology according to the present disclosure can be applied to all X-Y address type image capturing devices in which the pixels 2 are two-dimensionally arranged in a matrix form.

Application Example

Figure 23:
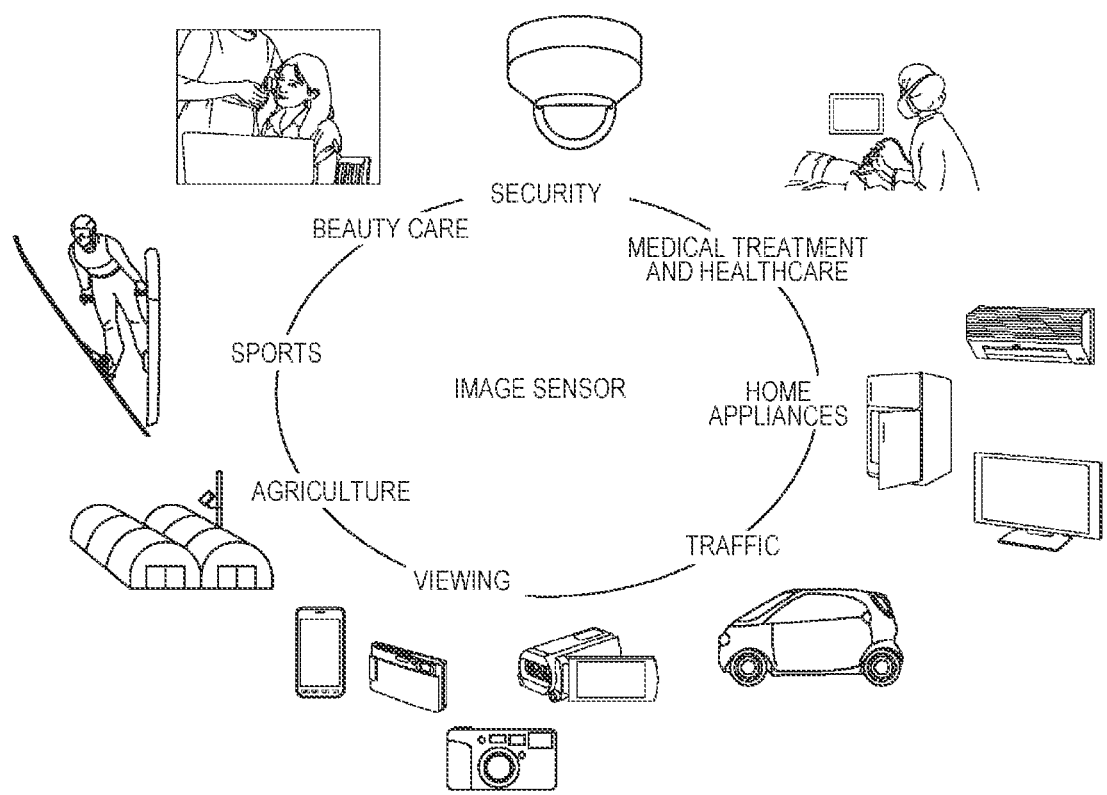
FIG. 23 is a diagram illustrating an application example of a technology according to the present disclosure.

The image capturing device of the present disclosure described above can be used in various devices that sense light such as visible light, infrared light, ultraviolet light, or X-ray, for example, as illustrated in FIG. 23. Specific examples of various devices are listed below.
- A device that captures an image provided for viewing, such as a digital camera and a portable device with a camera function
- A device provided for traffic, such as an in-vehicle sensor for capturing an image of the region in front of, behind, surrounding, or inside a vehicle, a monitoring camera for monitoring a traveling vehicle or a road, or a distance measurement sensor for measuring the distance between vehicles, for the purpose of safe driving such as automatic stop and recognition of driver's state
- A device provided for home appliances, such as a television, a refrigerator, and an air conditioner, to capture an image of the gesture of the user and perform a device operation in accordance with the gesture
- A device provided for medical treatment and healthcare, such as an endoscope or a device for capturing an image of blood vessels by receiving infrared light
- A device provided for security, such as a monitoring camera for security or a camera for personal authentication
- A device provided for beauty care, such as a skin measuring device for capturing an image of skin or a microscope for capturing an image of scalp
- A device provided for sports, such as an action camera or a wearable camera for use in sports
- A device provided for agriculture, such as a camera for monitoring the state of fields and crops <Application Example of Technology According to Present Disclosure>

The technology according to the present disclosure can be applied to various products. A more specific application example will be described below.

[Electronic Apparatus of Present Disclosure]

Here, application to an image capturing system such as a digital still camera or a video camera, a mobile terminal device having an image capturing function such as a mobile phone, or an electronic apparatus such as a copier using an image capturing device for an image reading section will be described.

(Image Capturing System)

Figure 24:
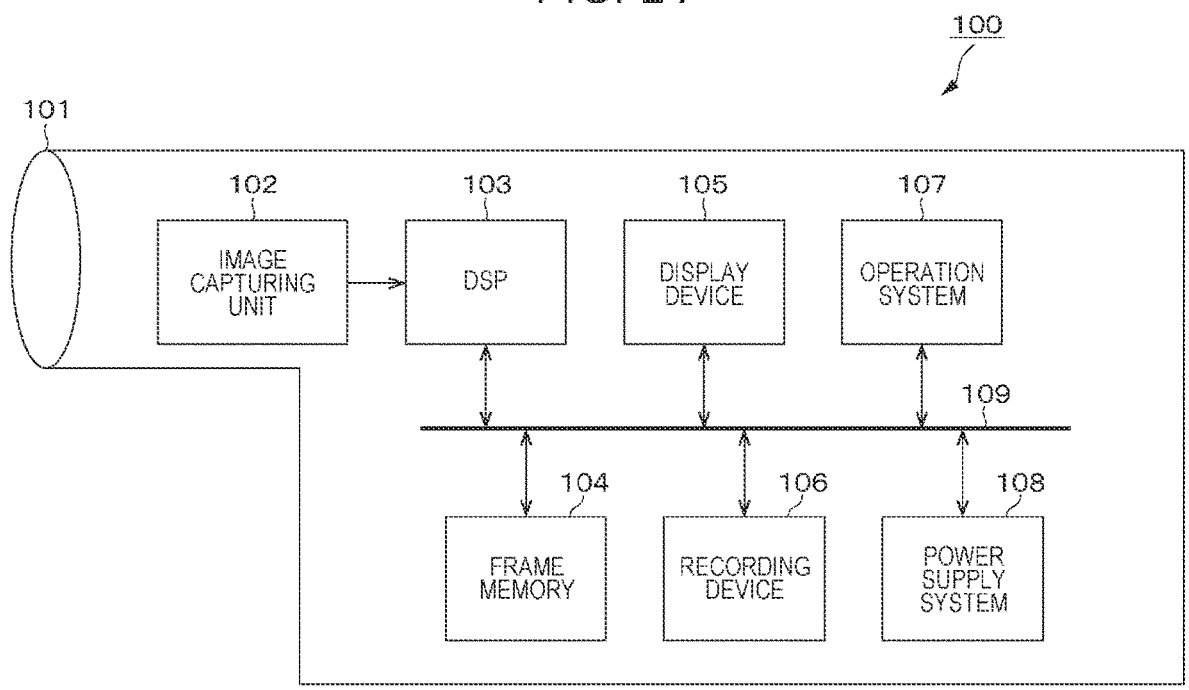
FIG. 24 is a block diagram illustrating an outline of a configuration example of an image capturing system which is an example of an electronic apparatus of the present disclosure.

FIG. 24 is a block diagram illustrating a configuration example of an image capturing system which is an example of the electronic apparatus of the present disclosure. As illustrated in FIG. 24, an image capturing system 100 according to this example includes an image capturing optical system 101 including a lens group and the like, an image capturing unit 102, a digital signal processor (DSP) circuit 103, a frame memory 104, a display device 105, a recording device 106, an operation system 107, a power supply system 108, and the like. Further, the DSP circuit 103, the frame memory 104, the display device 105, the recording device 106, the operation system 107, and the power supply system 108 are connected to each other via a bus line 109.

The image capturing optical system 101 receives incident light (image light) from a subject and forms an image on an image capturing surface of the image capturing unit 102. The image capturing unit 102 converts the amount of the incident light formed as the image on the image capturing surface by the optical system 101 into an electric signal in pixel units and outputs the electric signal as a pixel signal. The DSP circuit 103 performs general camera signal processing such as white balance processing, demosaic processing, or gamma correction processing.

The frame memory 104 is appropriately used for storing data in the process of the signal processing performed by the DSP circuit 103. The display device 105 includes a panel-type display device such as a liquid crystal display device or an organic electroluminescence (EL) display device, and displays a moving image or a still image captured by the image capturing unit 102. The recording device 106 records the moving image or still image captured by the image capturing unit 102 on a portable semiconductor memory, an optical disk, or a recording medium such as a hard disk drive (HDD).

The operation system 107 issues operation commands for various functions of the image capturing device 100 under the operation of the user. The power supply system 108 appropriately supplies various types of power that serve as operating power for the DSP circuit 103, the frame memory 104, the display device 105, the recording device 106, and the operation system 107 to these supply targets.

In the image capturing system 100 having the above-described configuration, an image capturing device (the image capturing device of the present disclosure) to which the technology according to the present disclosure is applied can be used as the image capturing unit 102. With the image capturing device to which the technology according to the present disclosure is applied, it is possible to easily optimize the area of the circuit chip (second semiconductor chip) in the COW structure. Therefore, the image capturing device can be used as the image capturing unit 102 to contribute to the miniaturization of the image capturing system.

[Example of Application to Moving Body]

The technology according to the present disclosure can be applied to various products. For example, the technology according to the present disclosure may be implemented as an image capturing device mounted in any one of moving bodies such as a vehicle, an electric vehicle, a hybrid electric vehicle, a motorcycle, a bicycle, a personal mobility device, a plane, a drone, a ship, a robot, a construction machine, and an agricultural machine (tractor).

Figure 25:
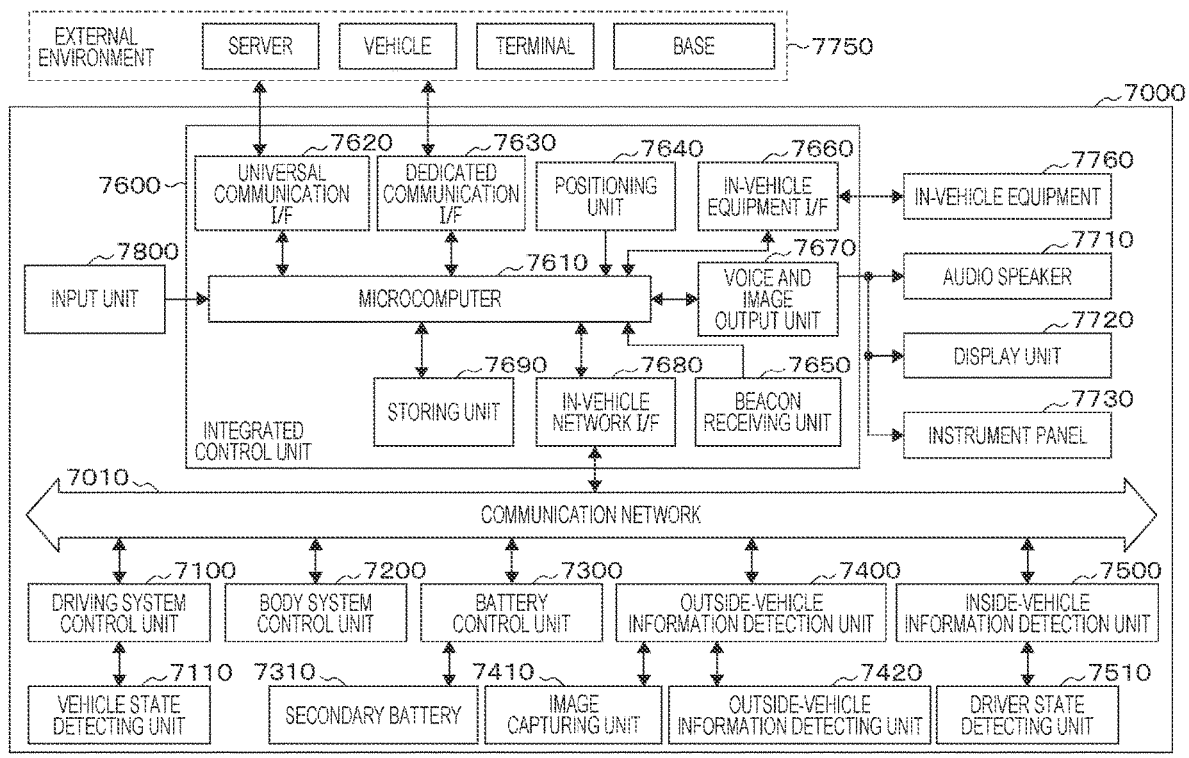
FIG. 25 is a block diagram illustrating a schematic configuration example of a vehicle control system which is an example of a moving body control system to which the technology according to the present disclosure can be applied.

FIG. 25 is a block diagram illustrating an example of a schematic configuration of a vehicle control system 7000 which is an example of a moving body control system to which the technology according to the present disclosure can be applied. The vehicle control system 7000 includes a plurality of electronic control units connected through a communication network 7010. In the example illustrated in FIG. 25, the vehicle control system 7000 includes a driving system control unit 7100, a body system control unit 7200, a battery control unit 7300, an outside-vehicle information detection unit 7400, an inside-vehicle information detection unit 7500, and an integrated control unit 7600. The communication network 7010 connecting the plurality of control units to one another may be, for example, an in-vehicle communication network according to any protocol such as a controller area network (CAN), a local interconnect network (LIN), a local area network (LAN), or a FlexRay (registered trademark).

Each control unit includes a microcomputer performing calculation processing according to various programs, a storing unit that stores programs executed by the microcomputer, parameters used for various calculations, or the like, and a driving circuit that drives various control target devices. Each control unit includes a communication I/F for performing communication with devices inside and outside a vehicle, a sensor, or the like through a wired or wireless communication, in addition to a network I/F for performing communication with another control unit through the communication network 7010. FIG. 25 illustrates, as functional components of the integrated control unit 7600, a microcomputer 7610, a universal communication I/F 7620, a dedicated communication I/F 7630, a positioning unit 7640, a beacon receiving unit 7650, an in-vehicle equipment I/F 7660, a voice and image output unit 7670, an in-vehicle network I/F 7680, and a storing unit 7690. Similarly, each of other control units also includes a microcomputer, a communication I/F, a storing unit, or the like.

The driving system control unit 7100 controls an operation of a device related to a driving system of a vehicle according to various programs. For example, the driving system control unit 7100 functions as a driving force generation device for generating a driving force of a vehicle such as an internal combustion engine or a driving motor, a driving force transferring mechanism for transferring a driving force to vehicle wheels, a steering mechanism for adjusting a steering angle of the vehicle, and a control device such as a brake device generating a braking force of the vehicle. The driving system control unit 7100 may have a function as a control device such as an antilock brake system (ABS) or an electronic stability control (ESC).

A vehicle state detecting unit 7110 is connected to the driving system control unit 7100. The vehicle state detecting unit 7110 includes, at least one of, for example, a gyro sensor that detects an angular velocity of an axial rotation motion of a vehicle body, an acceleration sensor that detects an acceleration of a vehicle, or sensors for detecting an acceleration pedal operation amount, a brake pedal operation amount, a steering angle of a steering wheel, engine revolutions per minute, a rotation speed of a vehicle wheel, or the like. The driving system control unit 7100 performs calculation processing by using a signal input from the vehicle state detecting unit 7110 to control an internal combustion engine, a driving motor, an electric power steering device, a brake device, or the like.

The body system control unit 7200 controls an operation of various devices mounted in a vehicle body according to various programs. For example, the body system control unit 7200 functions as a keyless entry system, a smart key system, a power window device, or a control device for various lamps such as a head lamp, a back lamp, a brake lamp, a blinker, and a fog lamp. In this case, electric waves sent from a portable machine substituting for a key and a signal of various switches can be input to the body system control unit 7200. The body system control unit 7200 receives the electric waves or the signal to control a doorlock device of a vehicle, a power window device, a lamp, or the like.

The battery control unit 7300 controls a secondary battery 7310 as a power supply source of a driving motor according to various programs. For example, information such as a battery temperature, a battery output voltage, or a state of charge of a battery is input to the battery control unit 7300 from a battery device including the secondary battery 7310. The battery control unit 7300 performs calculation processing by using the signal and performs a temperature adjustment control for the secondary battery 7310 or a control of a cooling device or the like included in the battery device.

The outside-vehicle information detection unit 7400 detects information regarding a region outside a vehicle in which the vehicle control system 7000 is mounted. For example, at least one of an image capturing unit 7410 or an outside-vehicle information detecting unit 7420 is connected to the outside-vehicle information detection unit 7400. The image capturing unit 7410 includes at least one of a time of flight (ToF) camera, a stereo camera, a single-lens camera, an infrared camera, or other cameras. The outside-vehicle information detecting unit 7420 includes at least one of, for example, an environment sensor for detecting a current weather or meteorological condition, or a surrounding information detection sensor for detecting another vehicle around the vehicle in which the vehicle control system 7000 is mounted, an obstacle, a pedestrian, or the like.

The environment sensor may be at least one of, for example, a raindrop sensor detecting rain, a fog sensor detecting fog, a sunshine sensor detecting an amount of sunshine, or a snow sensor detecting snowfall. The surrounding information detection sensor may be at least one of an ultrasonic sensor, a radar device, or a light detection and ranging or laser imaging detection and ranging (LIDAR) device. The image capturing unit 7410 and the outside-vehicle information detecting unit 7420 may be included as individual sensors or devices, respectively, or may be included as a device in which a plurality of sensors or devices is integrated.

Figure 26:
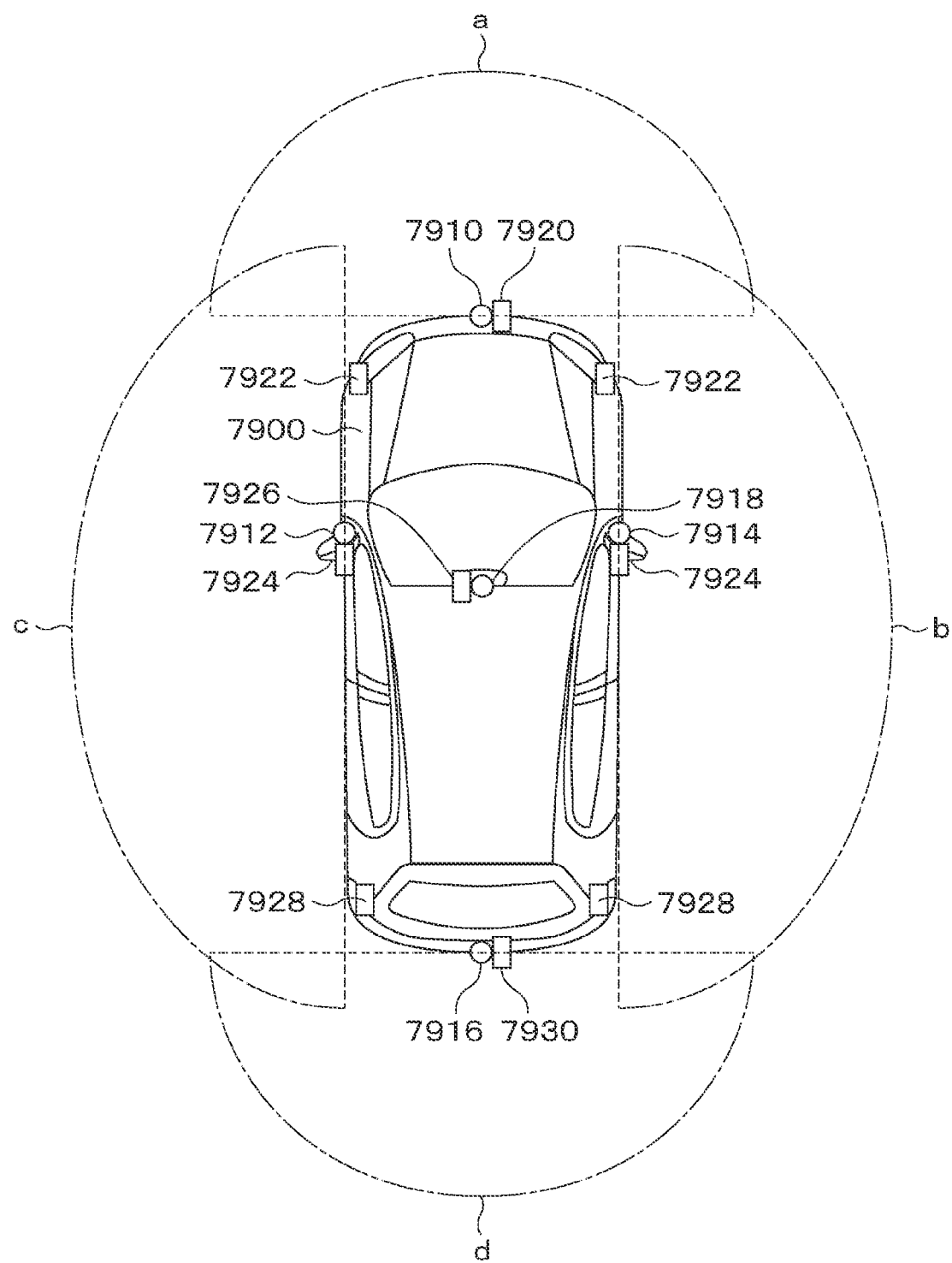
FIG. 26 is a diagram illustrating an example of installation positions of an image capturing unit and an outside-vehicle information detecting unit in the moving body control system.

Here, FIG. 26 illustrates an example of installation positions of the image capturing unit 7410 and the outside-vehicle information detecting unit 7420. Image capturing units 7910, 7912, 7914, 7916, and 7918 are each provided at at least one of, for example, a front nose, side mirrors, a rear bumper, a back door, or an upper portion of a windshield in a compartment of a vehicle 7900. The image capturing unit 7910 provided at the front nose and the image capturing unit 7918 provided at the upper portion of the windshield in the compartment mainly acquire an image of a region in front of the vehicle 7900. The image capturing units 7912 and 7914 provided at side mirrors mainly acquire images of regions on both sides of the vehicle 7900. The image capturing unit 7916 provided at the rear bumper or the back door acquires an image of a region behind the vehicle 7900. The image capturing unit 7918 provided at the upper portion of the windshield in the compartment is used to mainly detect a preceding vehicle, a pedestrian, an obstacle, a traffic light, a traffic sign, a lane, or the like.

Note that FIG. 26 illustrates an example of shooting ranges of the respective image capturing units 7910, 7912, 7914, and 7916. An image capturing range a indicates an image capturing range of the image capturing unit 7910 provided at the front nose, image capturing ranges b and c indicate image capturing ranges of the image capturing units 7912 and 7914 provided at the side mirrors, respectively, and an image capturing range d indicates an image capturing range of the image capturing unit 7916 provided at the rear bumper or the back door. For example, pieces of image data captured by the image capturing units 7910, 7912, 7914, and 7916 are superimposed, thereby obtaining a bird's eye view image from above the vehicle 7900.

Outside-vehicle information detecting units 7920, 7922, 7924, 7926, 7928, and 7930 provided at the front, the rear, the sides, the corners, and the upper portion of the windshield in the compartment of the vehicle 7900, respectively, may be, for example, ultrasonic sensors or radar devices. The outside-vehicle information detecting units 7920, 7926, and 7930 provided at the front nose, the rear bumper, the back door, and the upper portion of the windshield in the compartment of the vehicle 7900, respectively, may be, for example, LIDAR devices. These outside-vehicle information detecting units 7920 to 7930 are used to mainly detect a preceding vehicle, a pedestrian, an obstacle, or the like.

Referring back to FIG. 25, the description will be continued. The outside-vehicle information detection unit 7400 causes the image capturing unit 7410 to capture an image of a region outside the vehicle, and receives the captured image data. Furthermore, the outside-vehicle information detection unit 7400 receives detection information from the connected outside-vehicle information detecting unit 7420. In a case where the outside-vehicle information detecting unit 7420 is an ultrasonic sensor, a radar device, or a LIDAR device, the outside-vehicle information detection unit 7400 sends ultrasonic waves, electromagnetic waves, or the like, and receives information of received reflected waves. The outside-vehicle information detection unit 7400 may perform processing of detecting an object such as a person, a vehicle, an obstacle, a sign, or a character on a road surface, or distance detection processing on the basis of the received information. The outside-vehicle information detection unit 7400 may perform environment recognition processing of recognizing rain, fog, a road surface condition, or the like on the basis of the received information. The outside-vehicle information detection unit 7400 may calculate a distance to an object outside the vehicle on the basis of the received information.

Furthermore, the outside-vehicle information detection unit 7400 may perform image recognition processing of recognizing a person, a vehicle, an obstacle, a sign, a character on a road surface, or the like, or distance detection processing on the basis of the received image data. The outside-vehicle information detection unit 7400 may generate a bird's eye view image or a panorama image by performing processing such as distortion correction or position matching with respect to the received image data, and combining image data captured by a different image capturing unit 7410. The outside-vehicle information detection unit 7400 may perform view point conversion processing by using image data captured by a different image capturing unit 7410.

The inside-vehicle information detection unit 7500 detects information regarding an inside region of the vehicle. For example, a driver state detecting unit 7510 detecting a state of a driver is connected to the inside-vehicle information detection unit 7500. The driver state detecting unit 7510 may include a camera capturing an image of a driver, a biosensor detecting biological information of the driver, a microphone collecting voice in the compartment, or the like. The biological sensor is provided at, for example, a seat surface, a steering wheel, or the like, and detects biological information of a passenger sitting on the seat surface or the driver holding the steering wheel. The inside-vehicle information detection unit 7500 may calculate a degree of fatigue or a degree of concentration of the driver, or determine whether or not the driver dozes off on the basis of detection information input from the driver state detecting unit 7510. The inside-vehicle information detection unit 7500 may perform processing such as noise canceling processing for a collected audio signal.

The integrated control unit 7600 controls an overall operation of the vehicle control system 7000 according to various programs. An input unit 7800 is connected to the integrated control unit 7600. The input unit 7800 is implemented by a device which can be subjected to an input operation by a passenger, such as a touch panel, a button, a microphone, a switch, or a lever. Data obtained by recognizing voice input through a microphone may be input to the integrated control unit 7600. The input unit 7800 may be a remote control device using, for example, infrared rays or other electric waves, or may be an external connection device corresponding to an operation of the vehicle control system 7000, such as a mobile phone or personal digital assistant (PDA). The input unit 7800 may also be, for example, a camera, and in this case, the passenger can input information by using a gesture. Alternatively, data obtained by detecting a motion of a wearable device worn by the passenger may be input. Moreover, the input unit 7800 may include an input control circuit generating an input signal on the basis of, for example, information input by the passenger or the like using the input unit 7800 described above, and outputting the input signal to the integrated control unit 7600. The passenger or the like operates the input unit 7800 to input various data to the vehicle control system 7000 or give an instruction on a processing operation.

The storing unit 7690 may include a read only memory (ROM) storing various programs executed by a microcomputer, and a random access memory (RAM) storing various parameters, calculation results, sensor values, or the like. Furthermore, the storing unit 7690 may be implemented by a magnetic storage device such as a hard disc drive (HDD), a semiconductor storage device, an optical storage device, or a magneto-optical storage device.

The universal communication I/F 7620 is a common communication I/F for relaying communication with various devices present in the external environment 7750. The universal communication I/F 7620 may implement a cellular communication protocol such as a global system of mobile communications (GSM, registered trademark), a WiMAX, a long term evolution (LTE), or an LTE-advanced (LTE-A), or other wireless communication protocols such as a wireless LAN (also called Wi-Fi (registered trademark)), and Bluetooth (registered trademark). The universal communication I/F 7620 may be connected to a device (for example, an application server or a control server) present on an external network (for example, the Internet, a cloud network, or a company-specific network) through, for example, a base station or an access point. Furthermore, the universal communication I/F 7620 may be connected to a terminal (for example, a terminal of a driver, a pedestrian, or a shop, or a machine type communication (MTC) terminal) present in the vicinity of a vehicle by using, for example, a peer to peer (P2P) technology.

The dedicated communication I/F 7630 is a communication I/F supporting a communication protocol set for the purpose of a use in a vehicle. The dedicated communication I/F 7630 may implement, for example, a wireless access in vehicle environment (WAVE) which is a combination of IEEE802.11p as a lower layer and IEEE1609 as a higher layer, dedicated short range communications (DSRC), or a cellular communication protocol as a standard protocol). The dedicated communication I/F 7630 typically performs V2X communication as a concept including one or more of vehicle-to-vehicle communication, vehicle-to-infrastructure communication, vehicle-to-home communication, and vehicle-to-pedestrian communication.

The positioning unit 7640 executes positioning by receiving, for example, a global navigation satellite system (GNSS) signal (for example, a global positioning system (GPS) signal from a GPS satellite) from a GNSS satellite, and generates position information including the latitude, the longitude, and an altitude of a vehicle. Note that the positioning unit 7640 may specify a current position by exchanging a signal with a wireless access point, or may acquire position information from a terminal such as a mobile phone, a PHS, or a smartphone having a positioning function.

The beacon receiving unit 7650 receives electric waves or electromagnetic waves sent from, for example, a radio station installed on a road, or the like, to acquire information such as a current position, a traffic jam, a curfew, or a time required. Note that the function of the beacon receiving unit 7650 may be included in the dedicated communication I/F 7630 described above.

The in-vehicle equipment I/F 7660 is a communication interface relaying connection between the microcomputer 7610 and various pieces of in-vehicle equipment 7760 present in a vehicle. The in-vehicle equipment I/F 7660 may establish wireless connection by using a wireless communication protocol such as a wireless LAN, Bluetooth (registered trademark), near field communication (NFC), or a wireless universal serial bus (WUSB). Furthermore, the in-vehicle equipment I/F 7660 may establish wired connection of a universal serial bus (USB), a high-definition multimedia interface (HDMI, registered trademark), a mobile high-definition link (MHL), or the like through a connection terminal (not shown) (and a cable as necessary). The in-vehicle equipment 7760 may include at least one of, for example, mobile equipment or wearable equipment of a passenger, or information equipment brought into or attached to a vehicle. Furthermore, the in-vehicle equipment 7760 may include a navigation device performing a route search to a certain destination. The in-vehicle equipment I/F 7660 exchanges a control signal or a data signal with these pieces of in-vehicle equipment 7760.

The in-vehicle network I/F 7680 is an interface relaying communication between the microcomputer 7610 and the communication network 7010. The in-vehicle network I/F 7680 transmits and receives a signal or the like according to a predetermined protocol supported by the communication network 7010.

The microcomputer 7610 of the integrated control unit 7600 controls the vehicle control system 7000 according to various programs on the basis of information acquired through at least one of the universal communication I/F 7620, the dedicated communication I/F 7630, the positioning unit 7640, the beacon receiving unit 7650, the in-vehicle equipment I/F 7660, or the in-vehicle network I/F 7680. For example, the microcomputer 7610 may calculate a target control value of a driving force generation device, a steering mechanism, or a brake device on the basis of the acquired information regarding the regions inside and outside the vehicle, and output a control instruction to the driving system control unit 7100. For example, the microcomputer 7610 may perform a cooperative control for the purpose of implementing functions of an advanced driver assistance system (ADAS) including vehicle collision avoidance, impact alleviation, following traveling based on an inter-vehicle distance, traveling while maintaining a vehicle speed, a vehicle collision warning, or a vehicle lane departure warning. Furthermore, the microcomputer 7610 may perform a cooperative control for the purpose of an automatic driving in which a vehicle autonomously travels without an operation by a driver or the like by controlling a driving force generation device, a steering mechanism, a brake device, or the like on the basis of acquired surrounding information of the vehicle.

The microcomputer 7610 may generate information regarding a three-dimensional distance between a vehicle and an object such as a structure or a person around the vehicle on the basis of information acquired through at least one of the universal communication I/F 7620, the dedicated communication I/F 7630, the positioning unit 7640, the beacon receiving unit 7650, the in-vehicle equipment I/F 7660, or the in-vehicle network I/F 7680, and create local map information including surrounding information of a current position of the vehicle. Furthermore, the microcomputer 7610 may predict a risk such as vehicle collision, proximity of a pedestrian or the like, or entering into a road during a curfew on the basis of the acquired information, and generate a warning signal. The warning signal may be, for example, a signal for generating a warning sound or lighting a warning lamp.

The voice and image output unit 7670 transmits an output signal of at least one of voice and an image to an output device which is capable of visually or acoustically notifying a passenger of a vehicle or an outside region of the vehicle of information. In the example in FIG. 25, an audio speaker 7710, a display unit 7720, and an instrument panel 7730 are illustrated as the output devices. The display unit 7720 may include at least one of, for example, an on-board display or a head-up display. The display unit 7720 may have an augmented reality (AR) display function. The output device may be a device other than the devices described above, such as headphones, a wearable device such as a glasses type display worn by a passenger, a projector, or a lamp. In a case where the output device is a display device, the display device visually displays a result and information in various forms such as a text, an image, a table, or a graph, the result being obtained by various pieces of processing performed by the microcomputer 7610 and the information being received from another control unit. Furthermore, in a case where the output device is a voice output device, the voice output device converts an audio signal including data of reproduced voice or sound into an analog signal, and visually outputs the analog signal.

Note that in the example illustrated in FIG. 25, at least two control units connected to each other through the communication network 7010 may be integrated as one control unit. Alternatively, each control unit may be configured by a plurality of control units. Moreover, the vehicle control system 7000 may include a different control unit (not illustrated). Furthermore, another control unit may have a part or all of functions of a certain control unit in the above description. That is, if transmission and reception of information are performed through the communication network 7010, predetermined calculation processing may be performed by a certain control unit. Similarly, a sensor or a device connected to a certain control unit may be connected to another control unit, and a plurality of control units may mutually transmit and receive detection information through the communication network 7010.

Hereinabove, an example of the vehicle control system to which the technology according to the present disclosure can be applied has been described. The technology according to the present disclosure can be applied to, for example, the image capturing units 7910, 7912, 7914, 7916, and 7918, or the outside-vehicle information detecting unit 7920, 7922, 7924, 7926, 7928, and 7930 among the components described above. Further, the image capturing device to which the technology according to the present disclosure is applied can be used as the image capturing unit or the outside-vehicle information detecting unit to contribute to the miniaturization of the image capturing unit or the outside-vehicle information detecting unit.

<Configurations that Present Disclosure can Take>

Note that the present disclosure can also have the following configuration.

<<A. Image Capturing Device>>

[A-1] An image capturing device having a stacked chip structure in which at least two semiconductor chips including a first semiconductor chip and a second semiconductor chip are stacked,
  in which pixels each including a light receiving portion are two-dimensionally arranged in a matrix form on the first semiconductor chip,
  a scanning section that selectively scans the pixel and a signal processing section that processes an analog signal output from the pixel are arranged on the second semiconductor chip, and
  the scanning section is arranged along pixel rows of the pixel arrangement in the matrix form.

[A-2] The image capturing device according to [A-1] described above,
  in which the signal processing section includes an analog-to-digital conversion section that converts the analog signal output from the pixel into a digital signal.

[A-3] The image capturing device according to [A-2] described above,
  in which the analog-to-digital conversion section includes a plurality of analog-to-digital converters provided corresponding to the pixel rows of the pixel arrangement in the matrix form.

[A-4] The image capturing device according to any one of [A-1] to [A-3] described above,
  in which a pixel control line wired on the first semiconductor chip and transmitting a signal output from the scanning section to the pixels includes a path wired along a column direction of the pixel arrangement, and a path wired along a row direction.

[A-5] The image capturing device according to [A-2] described above,
  in which the scanning section and the analog-to-digital conversion section include units having a predetermined circuit as a unit and arranged in parallel,
  the number of units of the scanning section is proportional to the number of rows of the pixel arrangement, and
  the number of units of the analog-to-digital conversion section is proportional to the number of columns of the pixel arrangement.

[A-6] The image capturing device according to [A-5] described above,
  in which the pitch of the unit of the scanning section and the pitch of the unit of the analog-to-digital conversion section are the same as each other.

[A-7] The image capturing device according to [A-5] described above,
  in which the pitch of the unit of the scanning section and the pitch of the unit of the analog-to-digital conversion section are different from each other, and
  the layout pitch ratio between the scanning section and the analog-to-digital conversion section is the same as the ratio between the numbers of rows/columns of the pixel arrangement.

[A-8] The image capturing device according to any one of [A-1] to [A-7] described above,
  in which the second semiconductor chip is constituted by two chips provided at opposite end portions of the first semiconductor chip in the column direction.

[A-9] The image capturing device according to [A-8] described above,
  in which the scanning section and the analog-to-digital conversion section are arranged on each of the two chips.

[A-10] The image capturing device according to [A-8] described above,
  in which the scanning section is arranged on one of the two chips, and the analog-to-digital conversion section is arranged on the other one of the two chips.

[A-11] The image capturing device according to any one of [A-1] to [A-10] described above,
  in which a connection portion that electrically connects the first semiconductor chip and the second semiconductor chip is a through silicon via (TSV) or a copper-copper connection (Cu—Cu connection).

[A-12] The image capturing device according to [A-11] described above,
  in which in a case where the connection portion is the copper-copper connection (Cu—Cu connection),
  the scanning section is arranged at a central portion in the column direction.

[A-13] The image capturing device according to [A-11] described above,
  in which the pixel control line wired on the first semiconductor chip and transmitting the signal output from the scanning section to the pixels includes the path wired along the column direction of the pixel arrangement and the path wired along the row direction, and
  the path wired along the column direction is laid out in a wiring shape in which the path is shifted in the row direction by a predetermined amount at a predetermined length interval.

[A-14] The image capturing device according to [A-13] described above,
  in which a vertical signal line is laid out on a first metal layer, the path of the pixel control line in the column direction is laid out on a second metal layer, the path of the pixel control line in the row direction is laid out on a third metal layer, and
  the shift of the path of the pixel control line in the column direction is realized by row-direction wiring on the second metal layer.

[A-15] The image capturing device according to [A-13] described above,
  in which a vertical signal line is laid out on a first metal layer, the path of the pixel control line in the column direction is laid out on a second metal layer, the path of the pixel control line in the row direction is laid out on a third metal layer, and
  the shift of the path of the pixel control line in the column direction is realized by diagonal-direction wiring on the second metal layer.

[A-16] The image capturing device according to [A-13] described above,
  in which a vertical signal line and the path of the pixel control line in the column direction are laid out on a first metal layer, the path of the pixel control line in the row direction is laid out on a second metal layer, and
  the shift of the path of the pixel control line in the column direction is realized by row-direction wiring or diagonal-direction wiring on the second metal layer.

<<B. Electronic Apparatus>>

[B-1] An electronic apparatus including an image capturing device that has a stacked chip structure in which at least two semiconductor chips including a first semiconductor chip and a second semiconductor chip are stacked,
  in which pixels each including a light receiving portion are two-dimensionally arranged in a matrix form on the first semiconductor chip,
  a scanning section that selectively scans the pixel and a signal processing section that processes an analog signal output from the pixel are arranged on the second semiconductor chip, and the scanning section is arranged along pixel rows of the pixel arrangement in the matrix form.

[B-2] The electronic apparatus according to [B-1] described above,
  in which the signal processing section includes an analog-to-digital conversion section that converts the analog signal output from the pixel into a digital signal.

[B-3] The electronic apparatus according to [B-2] described above,
  in which the analog-to-digital conversion section includes a plurality of analog-to-digital converters provided corresponding to the pixel rows of the pixel arrangement in the matrix form.

[B-4] The electronic apparatus according to any one of [B-1] to [B-3] described above,
  in which a pixel control line wired on the first semiconductor chip and transmitting a signal output from the scanning section to the pixels includes a path wired along a column direction of the pixel arrangement, and a path wired along a row direction.

[B-5] The electronic apparatus according to [B-2] described above,
  in which the scanning section and the analog-to-digital conversion section include units having a predetermined circuit as a unit and arranged in parallel,
  the number of units of the scanning section is proportional to the number of rows of the pixel arrangement, and
  the number of units of the analog-to-digital conversion section is proportional to the number of columns of the pixel arrangement.

[B-6] The electronic apparatus according to [B-5] described above,
  in which the pitch of the unit of the scanning section and the pitch of the unit of the analog-to-digital conversion section are the same as each other.

[B-7] The electronic apparatus according to [B-5] described above,
  in which the pitch of the unit of the scanning section and the pitch of the unit of the analog-to-digital conversion section are different from each other, and
  the layout pitch ratio between the scanning section and the analog-to-digital conversion section is the same as the ratio between the numbers of rows/columns of the pixel arrangement.

[B-8] The electronic apparatus according to any one of [B-1] to [B-7] described above,
  in which the second semiconductor chip is constituted by two chips provided at opposite end portions of the first semiconductor chip in the column direction.

[B-9] The electronic apparatus according to [B-8] described above,
  in which the scanning section and the analog-to-digital conversion section are arranged on each of the two chips.

[B-10] The electronic apparatus according to [B-8] described above,
  in which the scanning section is arranged on one of the two chips, and the analog-to-digital conversion section is arranged on the other one of the two chips.

[B-11] The electronic apparatus according to any one of [B-1] to [B-10] described above,
  in which a connection portion that electrically connects the first semiconductor chip and the second semiconductor chip is a through silicon via (TSV) or a copper-copper connection (Cu—Cu connection).

[B-12] The electronic apparatus according to [B-11] described above,
  in which in a case where the connection portion is the copper-copper connection (Cu—Cu connection),
  the scanning section is arranged at a central portion in the column direction.

[B-13] The electronic apparatus according to [B-11] described above,
  in which the pixel control line wired on the first semiconductor chip and transmitting the signal output from the scanning section to the pixels includes the path wired along the column direction of the pixel arrangement and the path wired along the row direction, and
  the path wired along the column direction is laid out in a wiring shape in which the path is shifted in the row direction by a predetermined amount at a predetermined length interval.

[B-14] The electronic apparatus according to [B-13] described above,
  in which a vertical signal line is laid out on a first metal layer, the path of the pixel control line in the column direction is laid out on a second metal layer, the path of the pixel control line in the row direction is laid out on a third metal layer, and
  the shift of the path of the pixel control line in the column direction is realized by row-direction wiring on the second metal layer.

[B-15] The electronic apparatus according to [B-13] described above,
  in which a vertical signal line is laid out on a first metal layer, the path of the pixel control line in the column direction is laid out on a second metal layer, the path of the pixel control line in the row direction is laid out on a third metal layer, and
  the shift of the path of the pixel control line in the column direction is realized by diagonal-direction wiring on the second metal layer.

[B-16] The electronic apparatus according to [B-13] described above,
  in which a vertical signal line and the path of the pixel control line in the column direction are laid out on a first metal layer, the path of the pixel control line in the row direction is laid out on a second metal layer, and
  the shift of the path of the pixel control line in the column direction is realized by row-direction wiring or diagonal-direction wiring on the second metal layer.

REFERENCE SIGNS LIST

11 First semiconductor chip (pixel chip)
12, $12_1$, $12_2$ Second semiconductor chip (circuit chip)
21 Pixel
22 Pixel array section
31 Circuit section
32, 32A, 32B Scanning section
33, 33A, 33B Analog-to-digital conversion section $35_1$, $35_2$, $35A_1$, $35A_2$, $35B_1$, $35B_2$ Connection portion of pixel control line
$36_1$, $36_2$, $36A_1$, $36A_2$, $36B_1$, $36B_2$ Connection portion of vertical signal
41 ($41_1$, $41_2$, $41_3$) Pixel control line
42 Vertical signal line

The invention claimed is:

1. An image capturing device, comprising:
a stacked chip structure in which at least two semiconductor chips are stacked, wherein the at least two semiconductor chips include a first semiconductor chip and a second semiconductor chip;
a plurality of pixels in a two-dimensional matrix form on the first semiconductor chip, wherein each of the plurality of pixels includes a light receiving portion;
a scanning section configured to selectively scan each of the plurality of pixels;
a signal processing section configured to process an analog signal output from each of the plurality of pixels, wherein
the scanning section and the signal processing section are on the second semiconductor chip, and
the scanning section is along a plurality of pixel rows of the plurality of pixels in the two-dimensional matrix form;
a connection portion configured to electrically connect the first semiconductor chip and the second semiconductor chip, wherein the connection portion is a copper-copper connection (Cu—Cu connection); and
a pixel control line wired on the first semiconductor chip, wherein
the pixel control line is configured to transmit a signal output from the scanning section to the of plurality pixels, and
the pixel control line includes:
a first path wired along a column direction of the two-dimensional matrix form,
a second path wired along a row direction of the two-dimensional matrix form, and
the first path is laid out in a wiring shape such that the first path is shifted in the row direction by a specific amount at a specific length interval.

2. The image capturing device according to claim 1, wherein the signal processing section includes an analog-to-digital conversion section configured to convert the analog signal output from each of the plurality of pixels into a digital signal.

3. The image capturing device according to claim 2, wherein the analog-to-digital conversion section includes a plurality of analog-to-digital converters corresponding to the plurality of pixel rows of the plurality of pixels in the two-dimensional matrix form.

4. The image capturing device according to claim 1, wherein the second semiconductor chip is configured by two chips at opposite end portions of the first semiconductor chip in the column direction.

5. The image capturing device according to claim 4, wherein the scanning section and an analog-to-digital conversion section of the signal processing section are on each of the two chips.

6. The image capturing device according to claim 4, wherein
the scanning section is on one of the two chips, and
an analog-to-digital conversion section of the signal processing section is on the other one of the two chips.

7. The image capturing device according to claim 1, wherein the connection portion is a through silicon via (TSV).

8. The image capturing device according to claim 1, the scanning section is at a central portion in the column direction.

9. The image capturing device according to claim 1, wherein
a vertical signal line is laid out on a first metal layer,
the first path of the pixel control line in the column direction is laid out on a second metal layer,
the path second of the pixel control line in the row direction is laid out on a third metal layer, and
a shift of the first path is based on row-direction wiring on the second metal layer.

10. The image capturing device according to claim 1, wherein
a vertical signal line is laid out on a first metal layer,
the first path of the pixel control line in the column direction is laid out on a second metal layer,
the second path of the pixel control line in the row direction is laid out on a third metal layer, and
a shift of the first path of the pixel control line in the column direction is based on diagonal-direction wiring on the second metal layer.

11. The image capturing device according to claim 1, wherein
a vertical signal line and the first path of the pixel control line are laid out on a first metal layer,
the second path of the pixel control line is laid out on a second metal layer, and
a shift of the first path is based on one of row-direction wiring or diagonal-direction wiring on the second metal layer.

12. An image capturing device, comprising:
a stacked chip structure in which at least two semiconductor chips are stacked, wherein the at least two semiconductor chips include a first semiconductor chip and a second semiconductor chip;
a plurality of pixels in a two-dimensional matrix form on the first semiconductor chip, wherein each of the plurality of pixels includes a light receiving portion;
a scanning section configured to selectively scan each of the plurality of pixels; and
a signal processing section configured to process an analog signal output from each of the plurality of pixels, wherein
the scanning section and the signal processing section are on the second semiconductor chip,
the scanning section is along a plurality of pixel rows of the plurality of pixels in the two-dimensional matrix form,
the signal processing section includes an analog-to-digital conversion section configured to convert the analog signal output from each of the plurality of pixels into a digital signal,
the scanning section includes a first plurality of units that includes a specific circuit as a unit of the first plurality of units,
the analog-to-digital conversion section includes a second plurality of units that includes the specific circuit as a unit of the second plurality of units,
the scanning section is parallel to the analog-to-digital conversion section,
a number of the first plurality of units is proportional to a number of the plurality of pixel rows of the plurality of pixels in the two-dimensional matrix form, and a number of the second plurality of units is proportional to a number of a plurality of pixel columns of the plurality of pixels in the two-dimensional matrix form.

13. The image capturing device according to claim 12, wherein a pitch of each of the first plurality is same as a pitch of each of the second plurality of units.

14. The image capturing device according to claim 12, wherein
- a pitch of each of the first plurality of units is different from_a pitch of each of the second plurality of units, and
- a layout pitch ratio between the scanning section and the analog-to-digital conversion section is same as a ratio between the numbers of the plurality of pixel rows and the number of the plurality of pixel columns.

15. An electronic apparatus, comprising:
an image capturing device that includes:
- a stacked chip structure in which at least two semiconductor chips are stacked, wherein the at least two semiconductor chips include a first semiconductor chip and a second semiconductor chip;
- a plurality of pixels in a two-dimensional matrix form on the first semiconductor chip, wherein each of the plurality of pixels includes a light receiving portion;
- a scanning section configured to selectively scan each of the plurality of pixels;
- a signal processing section configured to process an analog signal output from each of the plurality of pixels, wherein
  - the scanning section and the signal processing section are on the second semiconductor chip, and
  - the scanning section is along a plurality of pixel rows of the plurality of pixels in the two-dimensional matrix form;
- a connection portion configured to electrically connect the first semiconductor chip and the second semiconductor chip, wherein the connection portion is a copper-copper connection (Cu—Cu connection); and
- a pixel control line wired on the first semiconductor chip, wherein
  - the pixel control line is configured to transmit a signal output from the scanning section to the of plurality pixels, and
  - the pixel control line includes:
    - a first path wired along a column direction of the two-dimensional matrix form,
    - a second path wired along a row direction of the two-dimensional matrix form, and
    - the first path is laid out in a wiring shape such that the first path is shifted in the row direction by a specific amount at a specific length interval.

* * * * *